(12) United States Patent
Tong

(10) Patent No.: US 11,760,059 B2
(45) Date of Patent: Sep. 19, 2023

(54) METHOD OF ROOM TEMPERATURE COVALENT BONDING

(71) Applicant: INVENSAS BONDING TECHNOLOGIES, INC., San Jose, CA (US)

(72) Inventor: Qin-Yi Tong, Durham, NC (US)

(73) Assignee: ADEIA SEMICONDUCTOR BONDING TECHNOLOGIES INC., San Jose, CA (US)

(*) Notice: Subject to any disclaimer, the term of this patent is extended or adjusted under 35 U.S.C. 154(b) by 933 days.

(21) Appl. No.: 16/521,493

(22) Filed: Jul. 24, 2019

(65) Prior Publication Data

US 2019/0344534 A1 Nov. 14, 2019

Related U.S. Application Data

(60) Continuation of application No. 14/474,501, filed on Sep. 2, 2014, now Pat. No. 10,434,749, which is a
(Continued)

(51) Int. Cl.
*B32B 7/04* (2019.01)
*B81C 1/00* (2006.01)
(Continued)

(52) U.S. Cl.
CPC ............ *B32B 7/04* (2013.01); *B81C 1/00357* (2013.01); *H01L 21/3105* (2013.01);
(Continued)

(58) Field of Classification Search
CPC ....... H01L 2924/00; H01L 2224/80896; H01L 2224/29186; H01L 2224/80986;
(Continued)

(56) References Cited

U.S. PATENT DOCUMENTS 3,423,823 A 1/1969 Ansley
3,488,834 A 1/1970 Baird
(Continued)

FOREIGN PATENT DOCUMENTS

CA 2 399 282 A1 8/2001
EP 1 130 647 A2 9/2001
(Continued)

OTHER PUBLICATIONS

Abe et al., "Bonded SOI wafers with various substrates for IC fabrication," Proceedings of the Second International Symposium on Semiconductor Wafer Bonding: Science, Technology and Applications, The Electrochemical Society Proceedings, vol. 93-29 (1993), pp. 32-42.
(Continued)

*Primary Examiner* — Philip C Tucker
*Assistant Examiner* — Jimmy R Smith, Jr.
(74) *Attorney, Agent, or Firm* — Knobbe, Martens, Olson & Bear LLP

(57) ABSTRACT

A method of bonding includes using a bonding layer having a fluorinated oxide. Fluorine may be introduced into the bonding layer by exposure to a fluorine-containing solution, vapor or gas or by implantation. The bonding layer may also be formed using a method where fluorine is introduced into the layer during its formation. The surface of the bonding layer is terminated with a desired species, preferably an $NH_2$ species. This may be accomplished by exposing the bonding layer to an $NH_4OH$ solution. High bonding strength is obtained at room temperature. The method may also include bonding two bonding layers together and creating a fluorine distribution having a peak in the vicinity of the interface between the bonding layers. One of the bonding layers may include two oxide layers formed on each other. The fluorine
(Continued)

concentration may also have a second peak at the interface between the two oxide layers.

9 Claims, 14 Drawing Sheets

Related U.S. Application Data continuation of application No. 13/432,682, filed on Mar. 28, 2012, now Pat. No. 8,841,002, which is a continuation of application No. 12/954,735, filed on Nov. 26, 2010, now Pat. No. 8,163,373, which is a continuation of application No. 11/958,071, filed on Dec. 17, 2007, now Pat. No. 7,862,885, which is a continuation of application No. 11/442,394, filed on May 30, 2006, now Pat. No. 7,335,996, which is a division of application No. 10/440,099, filed on May 19, 2003, now Pat. No. 7,109,092.

(51) Int. Cl.
 H01L 21/3105 (2006.01)
 H01L 21/762 (2006.01)
 H01L 23/00 (2006.01)

(52) U.S. Cl.
 CPC ........ H01L 21/76251 (2013.01); H01L 24/26 (2013.01); H01L 24/29 (2013.01); H01L 24/81 (2013.01); H01L 24/83 (2013.01); H01L 24/92 (2013.01); B32B 2250/04 (2013.01); B81C 2201/019 (2013.01); B81C 2203/019 (2013.01); B81C 2203/0118 (2013.01); H01L 2224/0401 (2013.01); H01L 2224/08059 (2013.01); H01L 2224/29186 (2013.01); H01L 2224/80896 (2013.01); H01L 2224/81894 (2013.01); H01L 2224/81895 (2013.01); H01L 2224/8319 (2013.01); H01L 2224/8385 (2013.01); H01L 2224/83894 (2013.01); H01L 2224/83896 (2013.01); H01L 2224/9202 (2013.01); H01L 2224/9212 (2013.01); H01L 2224/92125 (2013.01); H01L 2924/01004 (2013.01); H01L 2924/01005 (2013.01); H01L 2924/01006 (2013.01); H01L 2924/01013 (2013.01); H01L 2924/01015 (2013.01); H01L 2924/01016 (2013.01); H01L 2924/01018 (2013.01); H01L 2924/01019 (2013.01); H01L 2924/01023 (2013.01); H01L 2924/01033 (2013.01); H01L 2924/01039 (2013.01); H01L 2924/01058 (2013.01); H01L 2924/01067 (2013.01); H01L 2924/01072 (2013.01); H01L 2924/01074 (2013.01); H01L 2924/01075 (2013.01); H01L 2924/01082 (2013.01); H01L 2924/07802 (2013.01); H01L 2924/10253 (2013.01); H01L 2924/1305 (2013.01); H01L 2924/14 (2013.01); H01L 2924/1461 (2013.01); H01L 2924/351 (2013.01); Y10T 156/10 (2015.01); Y10T 428/24355 (2015.01); Y10T 428/24942 (2015.01); Y10T 428/31504 (2015.04); Y10T 428/31678 (2015.04)

(58) Field of Classification Search
 CPC ... H01L 2224/81895; H01L 2224/9212; H01L 2924/10253; H01L 2924/1305; H01L 2924/1461; H01L 2924/351; H01L 2224/80895; H01L 2924/05442; H01L 2924/3512; H01L 21/3105; H01L 21/76251; H01L 2224/0401; H01L 2224/08059; H01L 2224/81894; H01L 2224/8319; H01L 2224/8385; H01L 2224/83894; H01L 2224/83896; H01L 2224/9202; H01L 2224/92125; H01L 24/26; H01L 24/29; H01L 24/81; H01L 24/83; H01L 24/92; H01L 2924/01004; H01L 2924/01005; H01L 2924/01006; H01L 2924/01013; H01L 2924/01015; H01L 2924/01016; H01L 2924/01018; H01L 2924/01019; H01L 2924/01023; H01L 2924/01033; H01L 2924/01039; H01L 2924/01058; H01L 2924/01067; H01L 2924/01072; H01L 2924/01074; H01L 2924/01075; H01L 2924/01082; H01L 2924/07802; H01L 2924/14; B32B 2250/04; B32B 7/04; B81C 1/00357; B81C 2201/019; B81C 2203/0118; B81C 2203/019; Y10T 156/10; Y10T 428/24355; Y10T 428/24942; Y10T 428/31504; Y10T 428/31678
 See application file for complete search history.

(56) References Cited

U.S. PATENT DOCUMENTS

| 3,508,980 | A | 4/1970 | Jackson, Jr. et al. |
|---|---|---|---|
| 3,534,467 | A | 10/1970 | Sachs et al. |
| 3,579,391 | A | 5/1971 | Buie |
| 3,587,166 | A | 6/1971 | Alexander et al. |
| 3,602,981 | A | 9/1971 | Kooi |
| 3,607,466 | A | 9/1971 | Miyazaki |
| 3,640,807 | A | 2/1972 | Van Dijk |
| 3,647,581 | A | 3/1972 | Mash |
| 3,888,708 | A | 6/1975 | Wise et al. |
| 4,416,054 | A | 11/1983 | Thomas et al. |
| 4,500,905 | A | 2/1985 | Shibata |
| 4,612,083 | A | 9/1986 | Yasumoto et al. |
| 4,617,160 | A | 10/1986 | Belanger et al. |
| 4,649,630 | A | 3/1987 | Boland et al. |
| 4,700,466 | A | 10/1987 | Nakagawa et al. |
| 4,754,544 | A | 7/1988 | Hanak |
| 4,829,018 | A | 5/1989 | Wahlstrom |
| 4,935,386 | A | 6/1990 | Nakagawa et al. |
| 4,962,879 | A | 10/1990 | Goesele et al. |
| 4,963,505 | A | 10/1990 | Fujii et al. |
| 4,970,175 | A | 11/1990 | Haisma et al. |
| 4,971,925 | A | 11/1990 | Alexander et al. |
| 4,978,421 | A | 12/1990 | Bassous et al. |
| 4,983,251 | A | 1/1991 | Haisma et al. |
| 4,992,847 | A | 2/1991 | Tuckerman |
| 5,007,071 | A | 4/1991 | Nakano et al. |
| 5,024,723 | A | 6/1991 | Goesele et al. |
| 5,034,343 | A | 7/1991 | Rouse et al. |
| 5,070,026 | A | 12/1991 | Greenwald et al. |
| 5,071,792 | A | 12/1991 | Van Vonno et al. |
| 5,081,061 | A | 1/1992 | Rouse et al. |
| 5,087,585 | A | 2/1992 | Hayashi |
| 5,089,431 | A | 2/1992 | Slatter et al. |
| 5,121,706 | A | 6/1992 | Nichols et al. |
| 5,162,251 | A | 11/1992 | Poole et al. |
| 5,183,783 | A | 2/1993 | Ohta et al. |
| 5,196,375 | A | 3/1993 | Hoshi |
| 5,234,860 | A | 8/1993 | Gluck |
| 5,236,118 | A | 8/1993 | Bower et al. |
| 5,238,875 | A | 8/1993 | Ogino |
| 5,264,113 | A | 11/1993 | Bartak et al. |
| 5,266,412 | A | 11/1993 | Bartak et al. |
| 5,266,511 | A | 11/1993 | Takao |
| 5,266,824 | A | 11/1993 | Abe et al. |
| 5,270,259 | A | 12/1993 | Ito et al. |
| 5,270,261 | A | 12/1993 | Bertin et al. |
| 5,272,104 | A | 12/1993 | Schrantz et al. |
| 5,321,301 | A | 6/1994 | Sato et al. |
| 5,324,365 | A | 6/1994 | Niwa |
| 5,324,687 | A | 6/1994 | Wojnarowski |

(56) References Cited

U.S. PATENT DOCUMENTS

| | | | |
|---|---|---|---|
| 5,344,524 A | 9/1994 | Sharma et al. |
| 5,354,695 A | 10/1994 | Leedy |
| 5,362,659 A | 11/1994 | Cartagena |
| 5,362,667 A | 11/1994 | Linn et al. |
| 5,376,579 A | 12/1994 | Annamalai |
| 5,380,681 A | 1/1995 | Hsu |
| 5,383,993 A | 1/1995 | Katada et al. |
| 5,394,303 A | 2/1995 | Yamaji |
| 5,407,506 A * | 4/1995 | Goetz .................. H01L 25/50 257/E21.705 |
| 5,407,856 A | 4/1995 | Quenzer et al. |
| 5,413,952 A | 5/1995 | Pages et al. |
| 5,413,955 A | 5/1995 | Lee et al. |
| 5,420,043 A | 5/1995 | Niwa |
| 5,420,449 A | 5/1995 | Oji |
| 5,421,953 A | 6/1995 | Nagakubo et al. |
| 5,422,302 A | 6/1995 | Yonehara et al. |
| 5,427,638 A | 6/1995 | Goetz et al. |
| 5,432,729 A | 7/1995 | Carson et al. |
| 5,441,591 A | 8/1995 | Imthurn et al. |
| 5,441,911 A | 8/1995 | Malhi |
| 5,451,547 A | 9/1995 | Himi et al. |
| 5,459,104 A | 10/1995 | Sakai |
| 5,460,659 A | 10/1995 | Krut |
| 5,485,540 A | 1/1996 | Eda |
| 5,489,554 A | 2/1996 | Gates |
| 5,497,033 A | 3/1996 | Filion et al. |
| 5,503,704 A | 4/1996 | Bower et al. |
| 5,514,235 A | 5/1996 | Mitani et al. |
| 5,516,727 A | 5/1996 | Broom |
| 5,517,057 A | 5/1996 | Beilstein et al. |
| 5,517,754 A | 5/1996 | Beilstein et al. |
| 5,523,602 A | 6/1996 | Horiuchi et al. |
| 5,534,465 A | 7/1996 | Frye et al. |
| 5,543,648 A | 8/1996 | Miyawaki |
| 5,546,494 A | 8/1996 | Eda |
| 5,547,896 A | 8/1996 | Linn et al. |
| 5,548,178 A | 8/1996 | Eda et al. |
| 5,561,303 A | 10/1996 | Schrantz et al. |
| 5,563,084 A | 10/1996 | Ramm et al. |
| 5,565,384 A | 10/1996 | Havemann |
| 5,567,657 A | 10/1996 | Wojnarowski et al. |
| 5,569,620 A | 10/1996 | Linn et al. |
| 5,578,501 A | 11/1996 | Niwa |
| 5,580,407 A | 12/1996 | Haisma et al. |
| 5,591,678 A | 1/1997 | Bendik et al. |
| 5,627,106 A | 5/1997 | Hsu |
| 5,647,932 A | 7/1997 | Taguchi et al. |
| 5,650,353 A | 7/1997 | Yoshizawa et al. |
| 5,652,436 A | 7/1997 | Stoner et al. |
| 5,653,019 A | 8/1997 | Bernhardt et al. |
| 5,661,316 A | 8/1997 | Kish, Jr. et al. |
| 5,661,901 A | 9/1997 | King |
| 5,666,706 A | 9/1997 | Tomita et al. |
| 5,668,057 A | 9/1997 | Eda et al. |
| 5,672,240 A | 9/1997 | Stoner et al. |
| 5,673,478 A | 10/1997 | Beene et al. |
| 5,698,471 A | 12/1997 | Namba et al. |
| 5,728,624 A | 3/1998 | Linn et al. |
| 5,741,733 A | 4/1998 | Bertagnolli et al. |
| 5,747,857 A | 5/1998 | Eda et al. |
| 5,753,529 A | 5/1998 | Chang et al. |
| 5,753,536 A | 5/1998 | Sugiyama et al. |
| 5,753,975 A * | 5/1998 | Matsuno ............. H01L 23/5329 257/E21.582 |
| 5,755,914 A | 5/1998 | Yonehara |
| 5,759,753 A | 6/1998 | Namba et al. |
| 5,760,478 A | 6/1998 | Bozso et al. |
| 5,763,318 A | 6/1998 | Bertin et al. |
| 5,766,984 A | 6/1998 | Ramm et al. |
| 5,771,555 A | 6/1998 | Eda et al. |
| 5,783,477 A | 7/1998 | Kish, Jr. et al. |
| 5,785,874 A | 7/1998 | Eda et al. |
| 5,793,115 A | 8/1998 | Zavracky et al. |
| 5,804,086 A | 9/1998 | Bruel |
| 5,807,783 A | 9/1998 | Gaul et al. |
| 5,821,665 A | 10/1998 | Onishi et al. |
| 5,841,197 A | 11/1998 | Adamic, Jr. |
| 5,849,627 A | 12/1998 | Linn et al. |
| 5,851,894 A | 12/1998 | Ramm |
| 5,858,876 A | 1/1999 | Chew |
| 5,866,942 A | 2/1999 | Suzuki et al. |
| 5,869,354 A | 2/1999 | Leedy |
| 5,872,025 A | 2/1999 | Cronin et al. |
| 5,876,497 A | 3/1999 | Atoji |
| 5,877,034 A | 3/1999 | Ramm et al. |
| 5,877,070 A | 3/1999 | Goesele et al. |
| 5,877,516 A | 3/1999 | Mermagen et al. |
| 5,880,010 A | 3/1999 | Davidson |
| 5,889,302 A | 3/1999 | Liu |
| 5,902,118 A | 5/1999 | Hubner |
| 5,903,018 A | 5/1999 | Shimawaki |
| 5,904,860 A | 5/1999 | Nagakubo et al. |
| 5,910,699 A | 6/1999 | Namba et al. |
| 5,915,167 A | 6/1999 | Leedy |
| 5,915,193 A | 6/1999 | Tong et al. |
| 5,920,142 A | 7/1999 | Onishi et al. |
| 5,936,280 A | 8/1999 | Liu |
| 5,966,622 A | 10/1999 | Levine et al. |
| 5,980,770 A | 11/1999 | Ramachandran et al. |
| 5,982,010 A | 11/1999 | Namba et al. |
| 5,985,412 A | 11/1999 | Gosele |
| 5,990,472 A | 11/1999 | Rinne |
| 5,990,562 A | 11/1999 | Vallett |
| 5,991,989 A | 11/1999 | Onishi et al. |
| 6,004,865 A | 12/1999 | Horiuchi et al. |
| 6,004,866 A | 12/1999 | Nakano et al. |
| 6,018,211 A | 1/2000 | Kanaboshi et al. |
| 6,048,752 A | 4/2000 | Linderman |
| 6,054,369 A | 4/2000 | Neilson et al. |
| 6,054,371 A | 4/2000 | Tsuchiaki et al. |
| 6,071,761 A | 6/2000 | Jacobs |
| 6,080,487 A | 6/2000 | Coggio et al. |
| 6,080,640 A | 6/2000 | Gardner et al. |
| 6,087,719 A | 7/2000 | Tsunashima |
| 6,087,760 A | 7/2000 | Yamaguchi et al. |
| 6,097,096 A | 8/2000 | Gardner et al. |
| 6,103,009 A | 8/2000 | Atoji |
| 6,120,917 A | 9/2000 | Eda |
| 6,133,640 A | 10/2000 | Leedy |
| 6,136,691 A | 10/2000 | Chen |
| 6,143,628 A | 11/2000 | Sato et al. |
| 6,146,992 A | 11/2000 | Lauterbach et al. |
| 6,153,445 A | 11/2000 | Yamazaki et al. |
| 6,153,495 A | 11/2000 | Kub et al. |
| 6,154,940 A | 12/2000 | Onishi et al. |
| 6,156,624 A | 12/2000 | Yamagata et al. |
| 6,159,767 A | 12/2000 | Eichelberger |
| 6,165,817 A | 12/2000 | Akram et al. |
| 6,180,496 B1 | 1/2001 | Farrens et al. |
| 6,190,778 B1 | 2/2001 | Batz-Sohn et al. |
| 6,194,323 B1 | 2/2001 | Downey et al. |
| 6,197,663 B1 | 3/2001 | Chandross et al. |
| 6,198,159 B1 | 3/2001 | Hosoma et al. |
| 6,204,079 B1 | 3/2001 | Aspar et al. |
| 6,236,141 B1 | 5/2001 | Sato et al. |
| 6,242,324 B1 | 6/2001 | Kub et al. |
| 6,246,068 B1 | 6/2001 | Sato et al. |
| 6,255,731 B1 | 7/2001 | Ohmi et al. |
| 6,255,899 B1 | 7/2001 | Bertin et al. |
| 6,270,202 B1 | 8/2001 | Namba et al. |
| 6,274,892 B1 | 8/2001 | Kub et al. |
| 6,278,174 B1 | 8/2001 | Havemann et al. |
| 6,313,012 B1 | 11/2001 | Horiuchi et al. |
| 6,316,332 B1 | 11/2001 | Lo et al. |
| 6,323,108 B1 | 11/2001 | Kub et al. |
| 6,328,796 B1 | 12/2001 | Kub et al. |
| 6,328,841 B1 | 12/2001 | Klumpp et al. |
| 6,348,706 B1 | 2/2002 | Sandhu |
| 6,423,640 B1 | 7/2002 | Lee et al. |
| 6,440,878 B1 | 8/2002 | Yang et al. |
| 6,448,174 B1 | 9/2002 | Ramm |
| 6,465,892 B1 | 10/2002 | Suga |

(56) References Cited

U.S. PATENT DOCUMENTS

| | | |
|---|---|---|
| 6,475,072 B1 * | 11/2002 | Canaperi .......... H01L 21/02074 |
| | | 257/E21.244 |
| 6,497,763 B2 | 12/2002 | Kub et al. |
| 6,562,647 B2 | 5/2003 | Zandman et al. |
| 6,563,133 B1 | 5/2003 | Tong |
| 6,563,224 B2 | 5/2003 | Leedy |
| 6,613,678 B1 | 9/2003 | Sakaguchi et al. |
| 6,627,531 B2 | 9/2003 | Enquist |
| 6,645,828 B1 | 11/2003 | Farrens et al. |
| 6,774,461 B2 | 8/2004 | Yeh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,905,557 B2 | 6/2005 | Enquist |
| 6,908,027 B2 | 6/2005 | Tolchinsky et al. |
| 6,908,832 B2 | 6/2005 | Farrens et al. |
| 6,909,146 B1 | 6/2005 | Linn et al. |
| 6,984,571 B1 | 1/2006 | Enquist |
| 6,989,314 B2 | 1/2006 | Rayssac et al. |
| 7,037,755 B2 | 5/2006 | Enquist |
| 7,041,178 B2 | 5/2006 | Tong et al. |
| 7,045,453 B2 | 5/2006 | Canaperi et al. |
| 7,105,980 B2 | 9/2006 | Abbott et al. |
| 7,109,092 B2 | 9/2006 | Tong |
| 7,119,400 B2 | 10/2006 | Burden |
| 7,126,212 B2 | 10/2006 | Enquist et al. |
| 7,193,423 B1 | 3/2007 | Dalton et al. |
| 7,335,572 B2 | 2/2008 | Tong et al. |
| 7,335,996 B2 | 2/2008 | Tong |
| 7,358,152 B2 | 4/2008 | Kub et al. |
| 7,387,944 B2 | 6/2008 | Tong et al. |
| 7,553,744 B2 | 6/2009 | Tong et al. |
| 7,750,488 B2 | 7/2010 | Patti et al. |
| 7,803,693 B2 | 9/2010 | Trezza |
| 7,807,549 B2 | 10/2010 | Tong et al. |
| 7,871,898 B2 | 1/2011 | Tong et al. |
| 8,053,329 B2 | 11/2011 | Tong et al. |
| 8,183,127 B2 | 5/2012 | Patti et al. |
| 8,349,635 B1 | 1/2013 | Gan et al. |
| 8,377,798 B2 | 2/2013 | Peng et al. |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,727,219 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,367,652 B2 | 6/2022 | Uzoh et al. |
| 2001/0016382 A1 | 8/2001 | Song et al. |
| 2002/0096760 A1 | 7/2002 | Simelgor et al. |
| 2002/0181827 A1 | 12/2002 | Johnson et al. |
| 2003/0020104 A1 | 1/2003 | Talin et al. |
| 2003/0057423 A1 | 3/2003 | Shimoda et al. |
| 2004/0009649 A1 | 1/2004 | Kub et al. |
| 2004/0084414 A1 | 5/2004 | Sakai et al. |
| 2004/0126993 A1 | 7/2004 | Chan et al. |
| 2004/0157407 A1 | 8/2004 | Tong et al. |
| 2004/0226656 A1 * | 11/2004 | Walsh ............... B24B 37/30 |
| | | 156/345.12 |

(56) References Cited

U.S. PATENT DOCUMENTS

| | | |
|---|---|---|
| 2005/0110159 A1 | 5/2005 | Oh et al. |
| 2006/0057945 A1 | 3/2006 | Hsu et al. |
| 2006/0292744 A1 | 12/2006 | Enquist et al. |
| 2007/0096294 A1 | 5/2007 | Ikeda et al. |
| 2007/0111386 A1 | 5/2007 | Kim et al. |
| 2007/0222048 A1 | 9/2007 | Huang |
| 2007/0295456 A1 | 12/2007 | Gudeman et al. |
| 2008/0061418 A1 | 3/2008 | Enquist et al. |
| 2008/0061419 A1 | 3/2008 | Enquist et al. |
| 2008/0093747 A1 | 4/2008 | Enquist et al. |
| 2011/0067803 A1 | 3/2011 | Tong et al. |
| 2011/0290552 A1 | 12/2011 | Palmateer et al. |
| 2012/0212384 A1 | 8/2012 | Kam et al. |
| 2013/0137245 A1* | 5/2013 | Robert .......... B81C 1/00626 438/478 |
| 2014/0175655 A1 | 6/2014 | Chen et al. |
| 2014/0225795 A1 | 8/2014 | Yu |
| 2015/0064498 A1 | 3/2015 | Tong |
| 2016/0343682 A1 | 11/2016 | Kawasaki |
| 2017/0062366 A1 | 3/2017 | Enquist |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338214 A1 | 11/2017 | Uzoh et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0344533 A1 | 11/2019 | Tong |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |

FOREIGN PATENT DOCUMENTS

| | | |
|---|---|---|
| JP | 54-116888 | 9/1979 |
| JP | 54-155770 | 12/1979 |
| JP | 60-167439 | 8/1985 |
| JP | 61-174661 | 8/1986 |
| JP | 62-031138 | 2/1987 |
| JP | 62-283655 | 12/1987 |
| JP | 63-237408 | 10/1988 |
| JP | 63-246841 | 10/1988 |
| JP | 64-007548 | 1/1989 |
| JP | 01-259546 | 10/1989 |
| JP | 02-177435 | 7/1990 |
| JP | 03-70155 | 3/1991 |
| JP | 03-101128 | 4/1991 |
| JP | 07-161705 | 6/1995 |
| JP | H07-249749 | 9/1995 |
| JP | 08-022987 | 1/1996 |
| JP | H08-195334 | 7/1996 |
| JP | H08-236695 | 9/1996 |
| JP | 08-298260 | 11/1996 |
| JP | 09-7908 | 1/1997 |
| JP | 09-027604 | 1/1997 |
| JP | 09-148321 | 6/1997 |
| JP | 09-330925 | 12/1997 |
| JP | 10-223636 | 8/1998 |
| JP | H10-223495 | 8/1998 |
| JP | 11-87203 | 3/1999 |
| JP | 2000-223703 | 8/2000 |

(56) References Cited

FOREIGN PATENT DOCUMENTS

| JP | 2001-144273 | 5/2001 |
|---|---|---|
| JP | 2013-33786 | 2/2013 |
| JP | 2018-160519 | 10/2018 |
| KR | 2002-81328 | 10/2002 |
| KR | 10-2015-0097798 | 8/2015 |
| TW | 389965 B | 5/2000 |
| WO | WO 96/13060 | 5/1996 |
| WO | WO 98/13860 | 4/1998 |
| WO | WO 01/61743 A1 | 8/2001 |
| WO | WO 2005/043584 A2 | 5/2005 |
| WO | WO 2006/100444 A1 | 9/2006 |
| WO | WO 2017/151442 A1 | 9/2017 |

OTHER PUBLICATIONS

Amirfeiz et al., "Formation of silicon structures by plasma activated wafer bonding," Electrochemical Society Proceedings: Semiconductor Wafer Bonding: Science, Technology, and Applications V, vol. 99-35, (1999), pp. 29-39.

Amirfeiz et al., "Formation of silicon structures by plasma-activated wafer bonding," Journal of The Electrochemical Society, 2000, vol. 147, No. 7, pp. 2693-2698.

Amirfeiz et al., "Formation of silicon structures by plasma activated wafer bonding," vol. 99-2, Abstract No. 963, 1999 Joint Int'l Meeting of the Electrochecm. Soc'y, Dec. 16, 1999.

Aoyama, T. et al., "Effect of fluorine on boron diffusion in thin silicon dioxides and oxynitride," J. Appl. Phys., (1995), vol. 77, pp. 417-419.

Arnold, Emil, "Silicon-on-insulator devices for high voltage and power IC applications," Proceedings of the Second International Symposium on Semiconductor Wafer Bonding: Science, Technology and Applications, The Electrochemical Society Proceedings, vol. 93-29 (1993), pp. 161-175.

Beitman et al., "Bonded SOI in a bipolar IC without trench isolation," Proceedings of the Second International Symposium on Semiconductor Wafer Bonding: Science, Technology and Applications, The Electrochemical Society Proceedings, vol. 93-29 (1993), pp. 144-151.

Bengtsson, S. et al., "Low Temperature Bonding," International Conference on Compliant & Alternative Substrate Technology, Meeting Program & Abstract Book, Sep. 29-23, p. 10.

Bengtsson, Stefan et al., "The Influence of Wafer Dimensions on the Contact Wave Velocity in Silicon Wafer Bonding," 69 Applied Physics Letters 3381 (1996).

Bertagnolli, E. et al., "Interchip Via Technology Three-Dimensional Metallization for Vertically Integrated Circuits," Electrochemical Society Proceedings, (2000), vol. 97-36, pp. 509-520.

Bollmann et al., Three Dimensional Metallization for Vertically Integrated Circuits, 1997 Materials for Advanced Metallization MAM '97 Abstracts Booklet 94.

Booth, D.E. et al., "Backside Imaging CCD Using Bonded and Etched Back Silicon on Epoxy," 97-36 Electrochemical Society Proceedings 584 (1998).

Booth et al., "Full three dimensional microcircuit integration techniques using wafer bonding," Proceedings of the Second International Symposium on Semiconductor Wafer Bonding: Science, Technology and Applications, The Electrochemical Society Proceedings, vol. 93-29 (1993), pp. 293-302.

Bower, R.W. et al., "Aligned Wafer Bonding: A Key to Three Dimensional Microstructures," J. Electronic Materials, May 1991, vol. 20, Issue 5, pp. 383-387.

Bower, Robert W. et al., "Design Considerations of a Digital Pressure Sensor Array," 1991 International Conference on SolidState Sensors and Actuators, 1991. Digest of Technical Papers, Transducers, pp. 312-314.

Bower, Robert W. et al., "Low Temperature S3N4 Direct Bonding," Applied Physics Letters, (1993), vol. 62, pp. 3485-3487.

Brugger et al., "High-precision aligned silicon wafer bonding for a micromachined AFM sensor," Proceedings of the Second International Symposium on Semiconductor Wafer Bonding: Science, Technology and Applications, The Electrochemical Society Proceedings, vol. 93-29 (1993), pp. 363-372.

Burke, Barry E. et al., "Soft-X-Ray CCD Imagers for AXAF," IEEE Transactions on Electron Devices, Oct. 1997, vol. 44, Issue 10, pp. 1633-1642.

Canadian Office Action dated Aug. 23, 2013 for Canadian Application No. 2,526,481.

Canadian Office Action dated Oct. 23, 2012 in Canadian Patent Application No. 2,526,481 (with attached International Preliminary Report on Patentability and Written Opinion of the International Searching Authority in PCT/US2004/013306).

Cha et al., "Design considerations for wafer bonding of dissimilar materials," Proceedings of the Second International Symposium on Semiconductor Wafer Bonding: Science, Technology and Applications, The Electrochemical Society Proceedings, vol. 93-29 (1993), pp. 257-266.

Chang, K.M. et al., "Influences of deposition temperature on thermal stability and moisture resistance of chemical vapor deposited fluorinated silicon oxide by using indirect fluorinating precursor," Appl. Phys. Lett., 1996, vol. 69, pp. 1238-1240.

Christel et al., "Silicon fusion bonding: An important tool for the design of micromechanical silicon devices," Proceedings of the Second International Symposium on Semiconductor Wafer Bonding: Science, Technology and Applications, The Electrochemical Society Proceedings, vol. 93-29 (1993), pp. 327-339.

Chu, P. et al., "Semiconductor Applications", in Handbook of Plasma Immersion Ion Implantation and Deposition, 2000, pp. 637-681.

Ciarlo, D., "High- and low-temperature bonding techniques for microstructures," Proceedings of the Second International Symposium on Semiconductor Wafer Bonding: Science, Technology and Applications, The Electrochemical Society Proceedings, vol. 93-29 (1993), pp. 313-326.

Decision-Request for Trail Granted, Inter Partes Review, U.S. Pat. No. 7,335,996, Case IPR2013-00154, dated Aug. 9, 2013, in 19 pages.

Desmond et al., "Low-Temperature Atmospheric Silicon-Silicon Wafer Bonding for Power Electronic Applications," 97-36 Electrochemical Society Proceedings 459 (1998).

Desmond et al., "The effects of process-induced defects on the chemical selectivity of highly-doped boron etchstops," Proceedings of the Second International Symposium on Semiconductor Wafer Bonding: Science, Technology and Applications, The Electrochemical Society Proceedings, vol. 93-29 (1993), pp. 423-432.

Eda et al., "Quartz crystal on silicon technique using direct bonding," Proceedings of the Second International Symposium on Semiconductor Wafer Bonding: Science, Technology and Applications, The Electrochemical Society Proceedings, vol. 93-29 (1993), pp. 373-381.

Eom, C. B. et al., "Fabrication of Double Sided YBa2Cu3O7 Thin Films on 2 Inch Diameter LaAlO3 Wafers by Direct Wafer Bonding," IEEE Transactions on Applied Superconductivity, Jun. 1997, vol. 7, Issue 2, pp. 1244-1248.

Esashi, "Complex micromechanical structures by low temperature bonding," Proceedings of the Second International Symposium on Semiconductor Wafer Bonding: Science, Technology and Applications, The Electrochemical Society Proceedings, vol. 93-29 (1993), pp. 348-362.

European Search Report.

Farrens, S. N. et al., "A Kinetics Study of the Bond Strength of Direct Bonded Wafers," J. Electrochemical Society, Nov. 1994, vol. 141, No. 11, pp. 3225-3230.

Farrens et al., "Analysis of bond characteristics in Si direct-bonded materials," Proceedings of the Second International Symposium on Semiconductor Wafer Bonding: Science, Technology and Applications, The Electrochemical Society Proceedings, vol. 93-29 (1993), pp. 81-95.

Farrens et al., "Chemical free room temperature wafer to wafer direct bonding," J. Electrochem. Soc., The Electrochemical Society, Inc., Nov. 1995, vol. 142, No. 11. pp. 3949-3955.

(56) References Cited

OTHER PUBLICATIONS

Farrens et al., "Chemical free wafer bonding of silicon to glass and sapphire," Electrochemical Society Proceedings vol. 95-7, 1995, pp. 72-77.

Farrens, S., "Low Temperature Wafer Bonding," Electromechanical Society Proceedings, 1997, vol. 97-36, pp. 425-436.

Feijóo et al, "BE-SOI with etch stop layers grown by RTCVD," Proceedings of the Second International Symposium on Semiconductor Wafer Bonding: Science, Technology and Applications, The Electrochemical Society Proceedings, vol. 93-29 (1993), pp. 267-279.

Feijoó, Diego et al., "Silicon Wafer Bonding Studied by Infrared Absorption Spectroscopy," Applied Physics Letters, (1994), vol. 65, pp. 2548-2550.

Feindt et al., "A complementary bipolar process on bonded wafers," Proceedings of the Second International Symposium on Semiconductor Wafer Bonding: Science, Technology and Applications, The Electrochemical Society Proceedings, vol. 93-29 (1993), pp. 189-196.

Final Written Decision, Inter PartesReview, U.S. Pat. No. 7,335,996, Case IPR2013-00154, dated Nov. 21, 2013, in 3 pages.

First Office Action (English translation) dated Oct. 6, 2015, issued in Japanese Patent Application No. 2012-107053, 7 pages.

Folta et al., "Low-temperature wafer bonding of surfaces using a reactive sputtered oxide," Proceedings of the Second International Symposium on Semiconductor Wafer Bonding: Science, Technology and Applications, The Electrochemical Society Proceedings, vol. 93-29 (1993), pp. 107-113.

Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.

Garofalini, Stephen H., "Atomistic structure and dynamic behavior of silica surfaces," Proceedings of the Second International Symposium on Semiconductor Wafer Bonding: Science, Technology and Applications, The Electrochemical Society Proceedings, vol. 93-29 (1993), pp. 57-70.

Gassel et al., "SIMOX and wafer bonding: Combination of competitors complements one another," Proceedings of the Second International Symposium on Semiconductor Wafer Bonding: Science, Technology and Applications, The Electrochemical Society Proceedings, vol. 93-29 (1993), pp. 433-442.

Gösele, U. et al., "Fundamental Issues in Wafer Bonding", J. Vac, Sci. Technol. A 17(4), Jul./Aug., (1999), American Vacuum Society, pp. 1145-1152.

Gösele, U. et al., "History and Future of Semiconductor Wafer Bonding," Solid State Phenomena, (1996), vol. 47-48, pp. 33-44.

Gösele, U. et al., "Semiconductor Wafer Bonding", Annu. Rev. Mater. Sci., Aug. 1998, vol. 28, pp. 215-241.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.

Gösele, U. et al., "Wafer Bonding for Microsystems Technologies", Sensors and Actuators 74, 1999 Elsevier Science S.A, 1999, pp. 161-168.

Hair, M.L. et al., "Silicon Chemistry," Wiley, New York (1987), pp. 482.

Haisma, J. et al.; "Silicon-on-Insulator Wafer Bonding-Wafer Thinning"; Japanese J. Appl. Phys, 1989, vol. 28, No. 8; pp. 1426-1443.

Harendt et al., "Bonded-wafer SOI smart power circuits in automotive applications," Proceedings of the Second International Symposium on Semiconductor Wafer Bonding: Science, Technology and Applications, The Electrochemical Society Proceedings, vol. 93-29 (1993), pp. 129-143.

Harendt, C. et al., "Vertical Polysilicon Interconnects by Aligned Wafer Bonding," Electrochemical Society Proceedings vol. 97-36, (1998), pp. 501-508.

Hayashi et al., "S takahashi and T. Kunio," Symp. VLSI Tech Dig., 1990, vol. 95.

Henttinen, K. et al., "Mechanically Induced Si Layer Transfer in Hydrogen-Implanted Si Wafers," Applied Physics Letters, Apr. 24, 2000, vol. 76, No. 17, pp. 2370-2372.

Hobart, K.D. et al., "Fabrication of a Double-Side IGBT by Very Low Temperature Wafer Bonding," 1999 Proceedings of the 11th International Symposium on Power Semiconductor Devices and Ics, IEEE, (1999), pp. 45-48.

Horning et al., "Wafer-to-wafer bond characterization by defect decoration etching," Proceedings of the Second International Symposium on Semiconductor Wafer Bonding: Science, Technology and Applications, The Electrochemical Society Proceedings, vol. 93-29 (1993), pp. 199-206.

Huang, Qing-An et al., "Biased-Voltage Controlled Thinning for Bonded Silicon-On-Insulator Wafers," Applied Physics Letters, May 29, 1995, vol. 66, pp. 2990-2991.

Hughes, Donald L., "Silicon-silicon direct wafer bonding," Proceedings of the Second International Symposium on Semiconductor Wafer Bonding: Science, Technology and Applications, The Electrochemical Society Proceedings, vol. 93-29 (1993), pp. 17-31.

Indian First Examination Report dated May 31, 2017 in Indian Application No. 5425/DELNP/2005, 7 pages.

Ismail, M.S. et al., "Digital Pressure-Switch Array with Aligned Silicon Fusion Bonding," J. Micromechanics and Microengineering, (1991), vol. 1, No. 4, pp. 231-236.

Ismail, M. S. et al., "One-Step Direct Bonding Process of Low Temperature Si3N4 and TiN Technology," 1993 Proceedings of the 7th International Conference on Solid State Sensors and Actuators, (1993), pp. 188-193.

Israeli Office Action dated Sep. 1, 2013 (with English translation) for Israeli Patent Application No. 205212.

Iyer et al., "Ultra thin silicon-on insulator using epitaxial etch stops," Proceedings of the Second International Symposium on Semiconductor Wafer Bonding: Science, Technology and Applications, The Electrochemical Society Proceedings, vol. 93-29 (1993), pp. 3-16.

Japanese Notice of Reasons for Rejection dated Nov. 7, 2011 in Japanese Patent Application No. 2006-532508 (submitting English translation only).

Japanese Office Action dated Apr. 19, 2011 in Japanese Patent Application No. 2006-532508 (submitting English translation only).

Japanese Office Action dated Feb. 12, 2014 in Japanese Patent Application No. 2013-108206 with English translation.

Japanese Office Action dated Jan. 22, 2013 in Japanese Patent Application No. 2009-532508 (English translation only).

Japanese Office Action dated Jun. 19, 2012 in Japanese Patent Application No. 2006-532508 (English translation).

Jiao et al., "Silicon direct bonding at low temperature near the boiling point of water," Proceedings of the Second International Symposium on Semiconductor Wafer Bonding: Science, Technology and Applications, The Electrochemical Society Proceedings, vol. 93-29 (1993), pp. 280-282.

Kawai et al, "Structure of the interface of a bonded wafer," Proceedings of the Second International Symposium on Semiconductor Wafer Bonding: Science, Technology and Applications, The Electrochemical Society Proceedings, vol. 93-29 (1993), pp. 216-224.

Kazor, A. et al., "Fluorine Enhanced Oxidation of Silicon at Low Temperatures," Appl. Phys. Lett., Sep. 19, 1994, vol. 65, No. 12, pp. 1572-1574.

Kim, S.P. et al., "Effect of water absorption on the residual stress in fluorinated silicon-oxide thin films fabricated by electron-cyclotron-resonance plasma-enhanced chemical-vapor deposition," Appl. Phys. Lett., 2001, vol. 79, pp. 185-187.

Kissinger, Gudrun et al., "Void-Free Silicon-Wafer-Bond Strengthening in the 200-400° C. Range," Sensors and Actuators A: Physical, Mar. 1993, vol. 36, Issue 2, pp. 149-156.

(56) References Cited

OTHER PUBLICATIONS

Köhler, J. et al., "Weibull Fracture Probability for Silicon Wafer Bond Evaluation," J. Electrochemical Society, (2000), vol. 147, Issue 12, pp. 4683-4687.

Korean Decision of Rejection and English Translation, dated Jan. 19, 2012, for Korean Patent Application No. 10-2005-7022105.

Krauter, G. et al., "Low Temperature Silicon Direct Bonding for Application in Micromechanics: Bonding Energies for Different Combinations of Oxides", Sensors and Actuators A 70, (1998), pp. 271-275.

Kub et al., "Electrical Characteristics of Low Temperature Direct Silicon-Silicon Bonding for Power Device Applications," Electrochemical Society Proceedings vol. 97-36, (1998), pp. 466-472.

Kuo, Y., "Deposition and etching mechanisms in plasma thin film processes," In Application of Particle and Laser Beams in Materials Technology, 1995, pp. 581-593.

Kurahashi et al., "Sensors Utilizing Si Wafer Direct Bonding at Low Temperature," 1991 Proceedings of the 2nd International Symposium on Micro Machine and Human Science 173, 173.

Lee, S. et al., "Effect of fluorine on dielectric properties of SiOF films," J. Appl. Phys., 80.9, (1996), pp. 5260-5263.

Li et al., "Low temperature direct bonding using pressure and temperature," SPIE, (1997), vol. 3184, pp. 124-127.

Ling et al., "Influence of bonding temperature on the electrical properties of Si/SiO2 interfaces in bonded silicon-on-insulator-wafers" Proceedings of the Second International Symposium on Semiconductor Wafer Bonding: Science, Technology and Applications, The Electrochemical Society Proceedings, vol. 93-29 (1993), pp. 453-462.

Ljungberg et al., "Buried silicide layers in silicon using wafer bonding with cobalt as interfacial layer," Proceedings of the Second International Symposium on Semiconductor Wafer Bonding: Science, Technology and Applications, The Electrochemical Society Proceedings, vol. 93-29 (1993), pp. 249-256.

Ljungberg, Karin et al., "Improved Direct Bonding of Si and SiO2 Surfaces by Cleaning in H2SO4:H2O2:HF," Applied Physics Letters, Jul. 31, 1995vol. 67, No. 5, pp. 650-652.

Ljungberg et al., "Spontaneity of hydrophobic Si—Si bonding and properties of the bonded interfaces," Proceedings of the Second International Symposium on Semiconductor Wafer Bonding: Science, Technology and Applications, The Electrochemical Society Proceedings, vol. 93-29 (1993), pp. 473-482.

Lu, Shi-Ji et al., "A New Silicon Micromachining Method Using SOI/SDB Technology," Sensors and Actuators A: Physical, Apr. 1990, vol. 23, Issues 1-3, pp. 961-963.

Macary et al, "Influence of the wafer cleaning on the electrical properties of Si—Si bonded wafers," Proceedings of the Second International Symposium on Semiconductor Wafer Bonding: Science, Technology and Applications, The Electrochemical Society Proceedings, vol. 93-29 (1993), pp. 463-472.

Machine English Translation of JP 09-148321 (Jun. 1997).

Maszara, W.P. et al., "Bonding of Silicon Wafers for Silicon-on-Insulator", J. Appl. Phys., Nov. 15, 1988, vol. 64, No. 10, pp. 4943-4950.

Matsumoto, Satoshi et al., "Thin-Film Quasi-SOI Power MOSFET Fabricated by Reversed Silicon Wafer Direct Bonding," IEEE Transactions on Electron Devices, Jan. 1998, vol. 45, Issue 1, pp. 105-109.

MatWeb silica data sheet (Nov. 2009).

McLachlan et al., "A bonded wafer bipolar process in manufacturing," Proceedings of the Second International Symposium on Semiconductor Wafer Bonding: Science, Technology and Applications, The Electrochemical Society Proceedings, vol. 93-29 (1993), pp. 43-54.

Mitani et al., "Investigation of the N-type inversion layer induced at the bottom of P-type active silicon layers in bonded SOI wafers," Proceedings of the Second International Symposium on Semiconductor Wafer Bonding: Science, Technology and Applications, The Electrochemical Society Proceedings, vol. 93-29 (1993), pp. 443-452.

Mumola et al., "Plasma-thinned silicon-on-insulator bonded wafers," Proceedings of the Second International Symposium on Semiconductor Wafer Bonding: Science, Technology and Applications, The Electrochemical Society Proceedings, vol. 93-29 (1993), pp. 410-422.

Nakanishi et al., "Studies on SiO2—SiO2 bonding with hydrofluoric acid—room temperature and low stress bonding technique for MEMS—" 1998 IEEE, pp. 609-614.

Nielsen, Henry et al., "Some Illumination on the Mechanism of SiO2 Etching in HF Solutions," J. Electrochem. Soc.: Solid-State Science and Technology, Mar. 1983, vol. 130, No. 3, pp. 708-711.

Nishizawa et al., "An advanced dielectric isolation structure for SOI-CMOS/BiCMOS VLSIs," Proceedings of the Second International Symposium on Semiconductor Wafer Bonding: Science, Technology and Applications, The Electrochemical Society Proceedings, vol. 93-29 (1993), pp. 176-188.

Oberlin, David W., "A New Air-Isolation Process for Monolithic Integrated Circuits," IEEE Transactions on Electron Devices, Jun. 1970, vol. 17, Issue 6, pp. 485-487.

Pankov et al., "Analysis of structural changes in plasma-deposited fluorinated silicon dioxide films caused by fluorine incorporation using ring-statistics based mechanism," Journal of Applied Physics AIP USA, Jul. 1, 1999, vol. 86, No. 1, pp. 275-280.

Plössl, A. et al., "Wafer Direct Bonding: Tailoring Adhesion Between Brittle Materials," Materials Science & Engineering, Mar. 10, 1999, vol. R25, Nos. 1-2, pp. 1-88.

Quenzer, H. J. et al., "Low Temperature Wafer Bonding for Micromechanical Applications," 1992 Micro Electro Mechanical Systems, 1992, MEMS '92, pp. 49-55.

Reiche et al., "Characterization of interfaces of directly bonded silicon wafers: A comparative study of secondary ion mass spectroscopy multiple internal reflection spectroscopy, and transmission electron microscopy," Jpn. J. Appl. Phys., vol. 35 (1996), pp. 2102-2107, Part 1, No. 4A, Apr. 1996.

Reiche et al., "The effect of a plasma pretreatment on the Si/Si bonding behaviouir," Electrochemical Society Proceedings, 1998, vol. 97-36, pp. 437-444.

Robb et al., "High temperature lateral dopant diffusion in WSi2, TiSi2 and TIN films," Proceedings of the Second International Symposium on Semiconductor Wafer Bonding: Science, Technology and Applications, The Electrochemical Society, Proceedings vol. 93-29 (1993), pp. 230-239.

Roberds et al., "Low temperature , in situ, plasma activated wafer bonding," Electrochecmical Society Proceedings, 1997, vol. 97-36, pp. 598-606.

Roberds et al., "Low temperature silicon direct bonding," Department of Mechanical, Aeronautical, and Materials Engineering, University of California, Davis, 1997, pp. 240-248.

Roberds, B.E. et al., "Wafer Bonding of GaAS, InP, and Si Annealed Without Hydrogen for Advanced Device Technologies," Electrochemical Society Proceedings, 1997, vol. 97-36, pp. 592-597.

Rouse et al, "Application of 150 mm bonded wafer technology to a power asic process," Proceedings of the Second International Symposium on Semiconductor Wafer Bonding: Science, Technology and Applications, The Electrochemical Society Proceedings, vol. 93-29 (1993), pp. 283-292.

Sailer et al., "Creating 3D Circuits Using Transferred Films," IEEE Circuits and Devices, Nov. 1997, vol. 13, Issue 6, pp. 27-30.

Saitoh et al., "Characterization of directly bonded silicon-on-insulator structures using spectroscopic ellipsometry," Proceedings of the Second International Symposium on Semiconductor Wafer Bonding: Science, Technology and Applications, The Electrochemical Society Proceedings, vol. 93-29 (1993), pp. 207-215.

Sakakibara et al., "A wafer bonded-SOI bipolar transistor," Proceedings of the Second International Symposium on Semiconductor Wafer Bonding: Science, Technology and Applications, The Electrochemical Society Proceedings, vol. 93-29 (1993), pp. 152-160.

Schmidt, Martin A., "Wafer-To-Wafer Bonding for Microstructure Formation," Proceedings of the IEEE, Aug. 1998, vol. 86, No. 8, pp. 1575-1586.

(56) References Cited

OTHER PUBLICATIONS

Schumacher, Andreas et al., "The Bonding Energies of Oxidized Silicon Wafers for Micromechanical Applications at Moderate Temperatures," Electrochemical Society Proceedings vol. 97-36, (1998), pp. 155-162.
Shajii et al., "A backside contact technology for a wafer-bonded liquid shear-stress sensor," Proceedings of the Second International Symposium on Semiconductor Wafer Bonding: Science, Technology and Applications, The Electrochemical Society Proceedings, vol. 93-29 (1993), pp. 340-347.
Shimbo, M. et al., "Silicon-to-Silicon Direct Bonding Method," J. Appl. Phys., Oct. 15, 1986, vol. 60, No. 8, pp. 2987-2989.
Singapore Written Opinion and Search Report dated Mar. 26, 2012 in Singapore Patent Application No. 200809148-0.
Söderbärg et al., "Formation of heat sinks using bonding and etch back technique in combination with diamond deposition," Proceedings of the Second International Symposium on Semiconductor Wafer Bonding: Science, Technology and Applications, The Electrochemical Society Proceedings, vol. 93-29 (1993), pp. 382-391.
Song, J. et al., "High quality fluorinated silicon oxide films prepared by plasma enhanced chemical vapor deposition at 120 C.," Appl. Phys. Lett., 1996, vol. 69, pp. 1876-1878.
Sooriakumar et al, "Thermal mismatch strain in anodically bonded silicon and glass," Proceedings of the Second International Symposium on Semiconductor Wafer Bonding: Science, Technology and Applications, The Electrochemical Society Proceedings, vol. 93-29 (1993), pp. 225-229.
Stanley, Timothy, "Revenue sensitivity to yield and starting wafer cost in SOI SRAM production," Proceedings of the Second International Symposium on Semiconductor Wafer Bonding: Science, Technology and Applications, The Electrochemical Society Proceedings, vol. 93-29 (1993), pp. 303-309.
Stengl, R. et al., "A Model for the Silicon Wafer Bonding Process", Jpn. J. Appl. Phys., Oct. 1989, vol. 28, No. 10, pp. 1735-1741.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Sun et al., "Cool Plasma Activated Surface in Silicon Wafer Direct Bonding Technology," Journal De Physique, Sep. 1988, vol. 49, No. C4, pp. C4-79-C4-82.
Takagi, Hideki et al., "Low-Temperature Direct Bonding of Silicon and Silicon Dioxide by the Surface Activation Method", Sensors and Actuators A, Oct. 1, 1998, vol. 70, No. 1-2, pp. 164-170.
Tong, Q.-Y. et al., "A Model of Low-Temperature Wafer Bonding and its Applications," J. Electrochem. Soc., May 1996, vol. 143, No. 5, pp. 1773-1779.
Tong et al., "A "smarter-cut" approach to low temperature silicon layer transfer," Appl. Phys. Lett. Jan. 5, 1998, vol. 72, No. 1, pp. 49-51.
Tong, Q.-Y. et al., "Diffusion and Oxide Viscous Flow Mechanism in SDB Process and Silicon Wafer Rapid Thermal Bonding," Electronic Letters, May 1990, vol. 26, Issue 11, pp. 697-699.
Tong et al., "Fabrication of Ultrathin SOI by SIMOX Wafer Bonding (SWB)," Journal of Electronic Materials, 1993, vol. 22, No. 7, pp. 763-768.
Tong, Q.-Y. et al., "Feasibility Study of VLSI Device Layer Transfer by CMP PETEOS Direct Bonding," Proceedings 1996 IEEE International SOI Conference, Oct. 1996, pp. 36 and 37.
Tong et al., "Hydrophobic silicon wafer bonding," Appl. Phys. Lett., Jan. 31, 1994, vol. 64, No. 5, pp. 625-627.
Tong, Q.-Y. et al., "Layer Splitting Process in Hydrogen-Implanted Si, Ge, SiC, and Diamond Substrates," Appl. Phys. Lett., Mar. 17, 1997, vol. 70, No. 11, pp. 1390-1392.
Tong et al., "Low temperature InP layer transfer," Electronics Letters, Feb. 18, 1999, vol. 35, No. 4, pp. 341-342.
Tong, Q.-Y. et al., "Low Temperature Si Layer Splitting," 1997 Proceedings, 1997 IEEE International SOI Conference, pp. 126-127.
Tong, Qin-Yi, "Low Temperature Wafer Direct Bonding", Journal of Microelectromechanical Systems, IEEE 1994, vol. 3, No. 1, Mar. 1994, pp. 29-35.
Tong et al., "Low temperature wafer direct bonding," Proceedings of the Second International Symposium on Semiconductor Wafer Bonding: Science, Technology and Applications, The Electrochemical Society Proceedings, vol. 93-29 (1993), pp. 96-106.
Tong, Q.-Y. et al., "Low Vacuum Wafer Bonding", Electrochemical and Solid-State Letters, 1998, vol. 1, No. 1, pp. 52-53.
Tong et al., "Materials with a Buried C60 Layer Produced by Direct Wafer Bonding," J. Electrochem. Soc., Oct. 1994, vol. 141, No. 10, pp. 137-138.
Tong, Q.-Y. et al., "Semiconductor Wafer Bonding: Recent Developments", Materials Chemistry and Physics, 1994, vol. 37, pp. 101-127.
Tong, Q.-Y. et al., Semiconductor Wafer Bonding Science and Technology, John Wiley & Sons, Inc., New York, 1999.
Tong, Q.-Y. et al., "Silicon Carbide Wafer Bonding," J. Electrochemical Society, Jan. 1995, vol. 142, No. 1, pp. 232-236.
Tong, Q.-Y. et al., "Thickness Considerations in Direct Silicon Wafer Bonding," J. Electrochemical Society, 142.11, (1995), pp. 3975-3979.
Tong, Q.-Y. et al., "Transfer of Semiconductor and Oxide Films by Wafer Bonding and Layer Cutting," J. Electronic Materials, (2000), vol. 29, No. 7, pp. 928-933.
Tong et al., "Ultrathin single-crystalline silicon on quartz (SOQ) by 150 C wafer bonding," Sensors and Actuators A: Physical, May 15, 1995, vol. 48, Issue 2, pp. 117-123.
Tong et al., "Wafer bonding and layer splitting for microsystems**," Advanced Materials, 1999, vol. 11, No. 17, pp. 1409-1425.
Tong, Q.-Y. et al., "Wafer Bonding of Si With Dissimilar Materials," Solid State and Integrated Circuit Technology, (1995), pp. 524-526.
Tsai, J.C.C. et al., VLSI Technology, McGraw-Hill, Auckland (1983), pp. 147.
Watt, V.H.C. et al., "Low Temperature Direct Bonding on Nonhydrophilic Surfaces," Electronic Letters, Apr. 29, 1994, vol. 30, Issue 9, pp. 693-695.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "Novel Two-Step SDB Technology for High-Performance Thin-Film SOI/MOSFET Applications," Electronics Letters, Mar. 6, 1989, vol. 25, No. 6, pp. 394-395.
Xu et al., "Silicon on Quartz by Solid-State Diffusion Bonding (SSDB) Technology," Electronics Letters, May 26, 1988, vol. 24, No. 11 pp. 691-692.
Yallup, Kevin, "Analog CMOS circuits on thick film SOI," Proceedings of the Second International Symposium on Semiconductor Wafer Bonding: Science, Technology and Applications, The Electrochemical Society Proceedings, vol. 93-29 (1993), pp. 117-128.
Yokoi, Hideki et al., "Analysis of GaInAsP Surfaces by Contact-Angle Measurement for Wafer Direct Bonding with Garnet Crystals," Japanese J. Applied Physics, (1999), vol. 38, Part 1, No. 8, pp. 4780.
*Ziptronix, Inc.* v. *Omnvision Technologies, Inc.*, Defendants' Third Supplemental Consolidated Invalidity Contentions Under Patent Local Rule 3-3, Case No. 4:10-cv-05525-SBA, filed Jun. 14, 2013, pp. 1-5379, (submitted in multiple parts).
Zucker et al., "Application of Oxygen Plasma Processing to Silicon Direct Bonding", Sensors and Actuators A, 36 (1993), pp. 227-231.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

(56) References Cited

OTHER PUBLICATIONS

Moriceau, H. et al., "Overview of recent direct wafer bonding advances and applications," Advances in Natural Sciences-Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
D'Agostino, Ricardo, "Plasma Etching of Si and SiO2 in SF6—O2 mixtures," 52(1) J. Appl. Phys. 162 (1981).
Duncan, T.M. et al., "Study of Fluorine in Silicate Glass With19 F Nuclear Magnetic Resonance Spectroscopy," J. Appl. Phys., Jul. 1, 1986, vol. 60, No. 1, pp. 130-136.
Graf, D. et al., "Reaction of Water with Hydrofluoric Acid Treated Silicon (111) and (100) Surfaces," J. Vac. Sci. Technol., May/Jun. 1989, A7(3), pp. 808-813.
Gui et al., "The effect of surface roughness on direct wafer bonding," Journal of Applied Physics, May 15, 1999, vol. 85, No. 10, pp. 7448-7454.
Judge, John S., "A Study of the Dissolution of SiO2 in Acidic Fluoride Solutions", J. Electrochem. Soc.: Solid State Science, Nov. 1971, vol. 118, No. 11, pp. 1772-1775.
Kasi, R. et al., "Chemistry of Fluorine in the Oxidation of Silicon," Appl. Phys. Lett., Jun. 24, 1991, vol. 58, No. 25, pp. 2975-2977.
Kouvatsos et al., "Silicon-Fluorine Bonding and Fluorine Profiling in SiO2 Films Grown by NF3-Enhanced Oxidation," Appl. Phys. Lett., Aug. 17, 1992, vol. 61, No. 7, pp. 780-782.
Li, Y., "Systematic Low Temperature Bonding and its Application to the Hydrogen Ion Cut Process and Three-Dimensional Structures," (1999).
Li, Y. et al., "Systematic Low Temperature Silicon Bonding Using Pressure and Temperature," 1998 Jpn. J. Appl. Phys. 37 (1998).
Morita, M. et al., "Fluorine-Enhanced Thermal Oxidation of Silicon in the Presence of NF3," Appl. Phys. Lett., Dec. 15, 1984, vol. 45, No. 12, pp. 1312-1314.
Nishioka, Yasushiro et al., "Dielectric Characteristics of Fluorinated Ultradry SiO2," Appl. Phys. Lett., Mar. 20, 1999, vol. 54, No. 12, pp. 1127-1129.
Niwano et al., "Morphology of Hydrofluoric Acid and Ammonium Fluoride-Treated Silicon Surfaces Studied by Surface Infrared Spectroscopy," J. Appl. Phys., Jun. 1, 1992, vol. 71, No. 11, pp. 5646-5649.
Rabinovich, Eliezer M. et al., "Retention of Fluorine in Silica Gels and Glass," J. Am. Ceram. Soc., 1989, vol. 72, No. 7, pp. 1229-1232.
*Samsung Electronics Co., LTD. and Samsung Electronics America, Inc.* v. *Invensas BondingTechnologies, Inc.*, Petition for Inter Partes Review of U.S. Pat. No. 9,431,368, dated Oct. 1, 2018, pp. 1-84, (IPR2019-00007_368_IPR_Petition).
*Samsung Electronics Co., LTD. and Samsung Electronics America, Inc.* v. *Invensas Bonding Technologies, Inc.*, Petition for Inter Partes Review of U.S. Pat. No. 9,391,143, dated Oct. 2, 2018, pp. 1-65, (IPR2019-00020_143_I_IPR_Petition)(Part 1).
*Samsung Electronics Co., LTD. and Samsung Electronics America, Inc.* v. *Invensas Bonding Technologies, Inc.*, Petition for Inter Partes Review of U.S. Pat. No. 9,391,143, dated Oct. 2, 2018, pp. 1-83, (IPR2019-00021_143_II_IPR_Petition)(Part 2).
*Samsung Electronics Co., LTD. and Samsung Electronics America, Inc.* v. *Invensas Bonding Technologies, Inc.*, Petition for Inter Partes Review of U.S. Pat. No. 7,553,744, dated Oct. 1, 2018, pp. 1-74, (Petition—U.S. Pat. No. 7,553,744—IPR2019-00001).
*Samsung Electronics Co., LTD. and Samsung Electronics America, Inc.* v. *Invensas Bonding Technologies, Inc.*, Petition for Inter Partes Review of U.S. Pat. No. 7,807,549, dated Oct. 1, 2018, pp. 1-69, (Petition—U.S. Pat. No. 7,807,549—IPR2019-00004).
*Samsung Electronics Co., LTD. and Samsung Electronics America, Inc.* v. *Invensas Bonding Technologies, Inc.*, Petition for Inter Partes Review of U.S. Pat. No. 7,807,549, dated Oct. 1, 2018, pp. 1-48, (Petition—U.S. Pat. No. 7,807,549—IPR2019-00005).
*Samsung Electronics Co., LTD. and Samsung Electronics America, Inc.* v. *Invensas Bonding Technologies, Inc.*, Petition for Inter Partes Review of U.S. Pat. No. 7,871,898, dated Oct. 1, 2018, pp. 1-82, (Petition—U.S. Pat. No. 7,871,898—IPR2019-00006).
*Samsung Electronics Co., LTD. and Samsung Electronics America, Inc.* v. *Invensas Bonding Technologies, Inc.*, Petition for Inter Partes Review of U.S. Pat. No. 8,153,505, dated Oct. 2, 2018, pp. 1-59, (Petition—U.S. Pat. No. 8,153,505—IPR2019-00022).
*Samsung Electronics Co., LTD. and Samsung Electronics America, Inc.* v. *Invensas Bonding Technologies, Inc.*, Petition for Inter Partes Review of U.S. Pat. No. 8,153,505, dated Oct. 2, 2018, pp. 1-67, (Petition—U.S. Pat. No. 8,153,505—IPR2019-00023).
Steinkirchner, Johann et al., "Silicon Wafer Bonding via Designed Monolayers," 7 Advanced Materials 7, 662 (1995).
Sunada, Takeshi et al., "The Role of Fluorine Termination in the Chemical Stability of HF-Treated Si Surfaces," Jpn, J. Appl. Phys., Dec. 1990, vol. 29, No. 12, pp. L2408-L2410.
Takagi et al., "Effect of surface roughness on room-temperature wafer bonding by Ar beam surface activation," Jpn. J. Appl. Phys., vol. 37, No. 7, Jul. 1998, pp. 4197-4203.
Takagi et al, "Low temperature direct bonding of silicon and silicon dioxide by the surface activation method," Transducers 1997, 1997 Int. Conf. on Solid State Sensors and Actuators, Jun. 16-19, 1997, pp. 657-660.
Takagi, Hideki et al., "Room-Temperature Bonding of Lithium Niobate and Silicon Wafers by Argon-Beam Surface Activation," Appl. Phys. Lett., Apr. 19, 1999, vol. 74, No. 16, pp. 2387-2389.
Takagi, H. et al., "Surface Activated Bonding of Silicon Wafers at Room Temperature," Appl. Phys. Lett., Apr. 15, 1996, vol. 68, No. 16, pp. 2222-2224.
Takagi, H. et al., "Transmission Electron Microscope observations of Si/Si Interface Bonded at Room Temperature by Ar Beam Surface Activation", Jpn. J. Appl. Phys., Mar. 1999, vol. 28, Part 1, No. 3A, pp. 1589-1594.
Vossen, John L. et al., Thin Film Processes, Academic Press (1978) (excerpts).
Vossen, John L. et al., Thin Film Processes II, Academic Press (1991) (excerpts).
Williams et al., "Mobile Fluoride Ions in SiO2", Journal of Applied Physics, Feb. 1975, vol. 46, No. 2, pp. 695-698.
Wright, Peter J. et al., "The Effect of Fluorine in Silicon Dioxide Gate Dielectrics," IEEE Transactions on Electron Devices, May 1989, vol. 36, No. 5, pp. 879-889.
Yoshimaru, M. et al., "Interaction Between Water and Fluorine-Doped Silicon Oxide Films Deposited by Plasma-Enhanced Chemical Vapor Deposition," J. Vac. Sci. Technol. A, Nov./Dec. 1997, vol. 15, No. 6, pp. 2915-2922.
*Ziptronix, Inc.* v. *Omnivision Technologies*, Complaint for Patent Infringement, Case 4:10-cv-05525-SBA, Document 48, filed May 4, 2011, pp. 1-29.
*Ziptronix, Inc.* v. *Ominvision Technologies*, Defendant TSMC's Answer and Affirmative Defenses to Ziptronix First Amended Complaint, Case No. 4:10-cv-05525-SBA, Document 49, filed May 4, 2011, pp. 1-45.
*Ziptronix, Inc.* v. *Omnivision Technologies*, Complaint for Patent Infringement, Case No. 4:10-cv-05525-SBA Document 1, filed Dec. 16, 2010, pp. 1-17.

\* cited by examiner

FIG. 8A
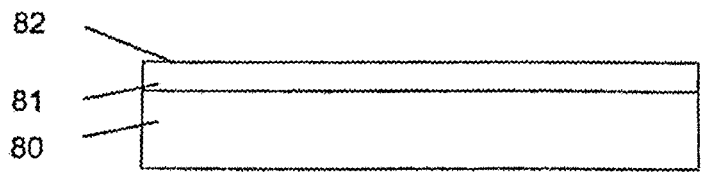
FIG. 8B
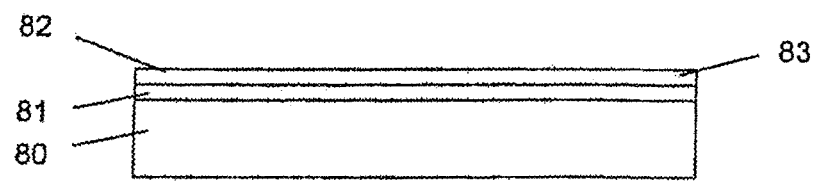
FIG. 8C
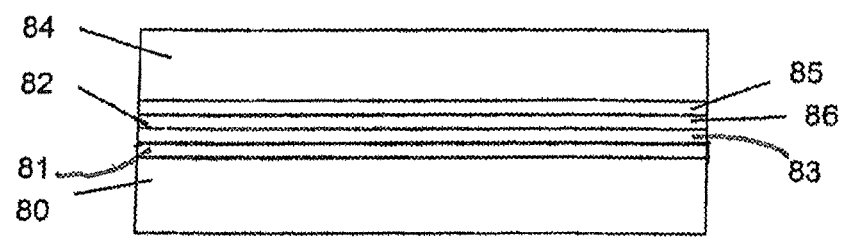
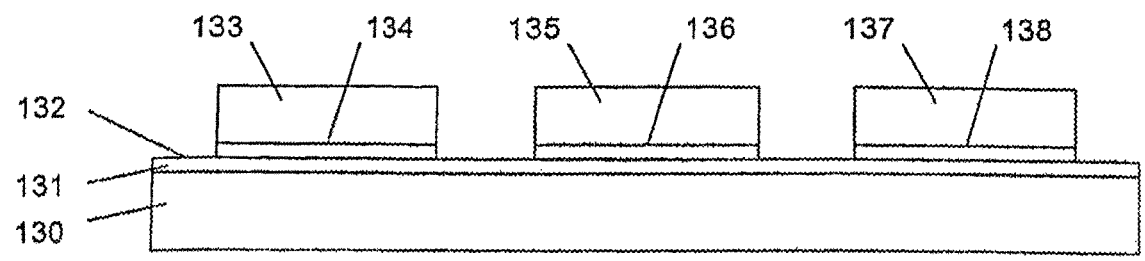
FIG. 13

METHOD OF ROOM TEMPERATURE COVALENT BONDING

CROSS-REFERENCE TO RELATED APPLICATIONS

This application is a continuation of and claims the benefit of priority under 35 U.S.C. § 120 from Ser. No. 14/474,501, filed Sep. 2, 2014, which is a continuation of Ser. No. 13/432,682, filed Mar. 28, 2012, now U.S. Pat. No. 8,841,002, which is a continuation of Ser. No. 12/954,735, filed Nov. 26, 2010, now U.S. Pat. No. 8,163,373, which is a continuation of Ser. No. 11/958,071, filed Dec. 17, 2007, now U.S. Pat. No. 7,862,885, which is a continuation of Ser. No. 11/442,394, filed May 30, 2006, now U.S. Pat. No. 7,335,996, which is a division of Ser. No. 10/440,099, filed May 19, 2003, now U.S. Pat. No. 7,109,092, the entire contents of which are incorporated herein by reference.

BACKGROUND OF THE INVENTION

Field of the Invention

The present invention relates to the field of wafer direct bonding at room temperature, and more particularly to the bonding of substrates for the fabrication of engineered substrates, encapsulation, and three-dimensional device integration using the effects of, and combined effects of, fluorine and ammonium in dielectrics, especially in a silicon oxide layer.

Description of the Related Art

As the physical limits of conventional CMOS device are being approached and the demands for high performance electronic systems are imminent, system-on-a chip (SOC) is becoming a natural solution of the semiconductor industry. For system-on-a chip preparation, a variety of functions are required on a chip. While silicon technology is the mainstay technology for processing a large number devices, many of the desired circuit and optoelectronic functions can now best be obtained from individual devices and/or circuits fabricated in materials other than silicon. Hence, hybrid systems which integrate non-silicon based devices with silicon based devices offer the potential to provide unique SOC functions not available from pure silicon or pure non-silicon devices alone.

One method for heterogeneous device integration has been the hetero-epitaxial growth of dissimilar materials on silicon. To date, such hetero-epitaxial growth has realized a high density of defects in the hetero-epitaxial grown films, largely due to the mismatches in lattice constants between the non-silicon films and the substrate.

Another approach to heterogeneous device integration has been wafer bonding technology. However, wafer bonding of dissimilar materials having different thermal expansion coefficients at elevated temperature introduces thermal stresses that lead to dislocation generation, debonding, or cracking. Thus, low temperature bonding is desired. Low temperature bonding is also desired for the bonding of dissimilar materials if the dissimilar materials include materials with low decomposition temperatures or temperature sensitive devices such as, for example, an InP heterojunction bipolar transistor or a processed Si device with ultrashallow source and drain profiles.

The design of processes needed to produce different functions on the same chip containing different materials is difficult and hard to optimize. Indeed, many of the resultant SOC chips (especially those at larger integration size) show a low yield. One approach has been to interconnect fully processed ICs by wafer adhesive bonding and layer transfer. See for example Y. Hayashi, S. Wada, K. Kajiyana, K. Oyama, R. Koh, S Takahashi and T. Kunio, Symp. VLSI Tech. Dig. 95 (1990) and U.S. Pat. No. 5,563,084, the entire contents of both references are incorporated herein by reference. However, wafer adhesive bonding usually operates at elevated temperatures and suffers from thermal stress, out-gassing, bubble formation and instability of the adhesive, leading to reduced yield in the process and poor reliability over time. The adhesive may also be incompatible with typical semiconductor manufacturing processes. Moreover, adhesive bond is usually not hermitic.

Room temperature wafer direct bonding is a technology that allows wafers to be bonded at room temperature without using any adhesive resulting in a hermitic bond. It is not prone to introduce stress and inhomogeneity as in the adhesive bonding. Further, if the low temperature bonded wafer pairs can withstand a thinning process, when one wafer of a bonded pair is thinned to a thickness less than the respective critical value for the specific materials combination, the generation of misfit dislocations in the layer and sliding or cracking of the bonded pairs during subsequent thermal processing steps are avoided. See for example Q.-Y. Tong and U. Gosele, Semiconductor Wafer Bonding: Science and Technology, John Wiley & Sons, New York, (1999), the entire contents of which are incorporated herein by reference.

SUMMARY OF THE INVENTION

The present invention is directed to a bonding method including forming first and second bonding layers on respective first and second elements, at least one of the bonding layers comprising a fluorinated oxide layer, bringing into contact the first and second bonding layers in ambient at room temperature, and forming a bond between said first and second layers at room temperature.

Forming at least one of said bonding layers comprising a fluorinated oxide layer may include forming an oxide layer and exposing the layer to a fluorine-containing solution, vapor or gas.

The method of forming a bonded structure according to the invention may also include bonding first and second bonding layers, and forming a fluorine concentration having a first peak in the vicinity of an interface between the first and second bonding layers and a second peak in at least one of said first and second layers separated from the first peak and located a distance from the first peak. One of the bonding layers may be an oxide layer, and the method may further include introducing fluorine into the oxide layer, and forming a second oxide layer on the first oxide layer after the introducing step.

The present invention is also directed to a bonded structure having first and second elements, first and second bonding layers respectively formed on the first and second elements, the first bonding layer non-adhesively bonded to the second bonding layer and the first bonding layer comprises a fluorinated oxide. In the structure the first bonding layer may comprise a first oxide layer formed on a second oxide layer, where a fluorine concentration in the first bonding layer has a first peak located in the vicinity of an interface between the first and second bonding layers and a second peak located at an interface between the first and second oxide layers.

It is an object of the present invention to achieve a very high density of covalent bonds at room temperature in air on the surface of silicon oxide covered wafers of a wide variety of materials.

A further object of the present invention is to reduce the density of a surface silicon oxide layer having a thickness of nm to 1 μm.

A still further object of the present invention is to enhance the diffusion rate of impurities and/or moisture absorption away from a bond interface.

Another object of the present invention is to obtain a bonding layer (nm to μm in thickness) having a Fluorine concentration greater than $1 \times 10^{17}$ cm$^{-3}$ on the surface.

An additional object of the present invention is to vary the density of covalent bonds across a bonding interface over the surface of an Integrated Circuit or device pattern using standard semiconductor process(es).

Another object of the present invention is to form a low-k dielectric locally or wholly on a silicon oxide surface with a fluorination treatment by standard semiconductor process (es).

A still further object of the present invention is to create a material whose surface can be atomically terminated with a desired group such that covalent bonds are formed when two such surfaces are brought into contact at room temperature.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein:

FIGS. 8A-8C illustrate an embodiment of the invention where a fluorinated layer is formed in a bonding layer;

FIG. 13 illustrates bonding a plurality of devices to a larger substrate;

DETAILED DESCRIPTION OF THE PREFERRED EMBODIMENTS

Figure 1:
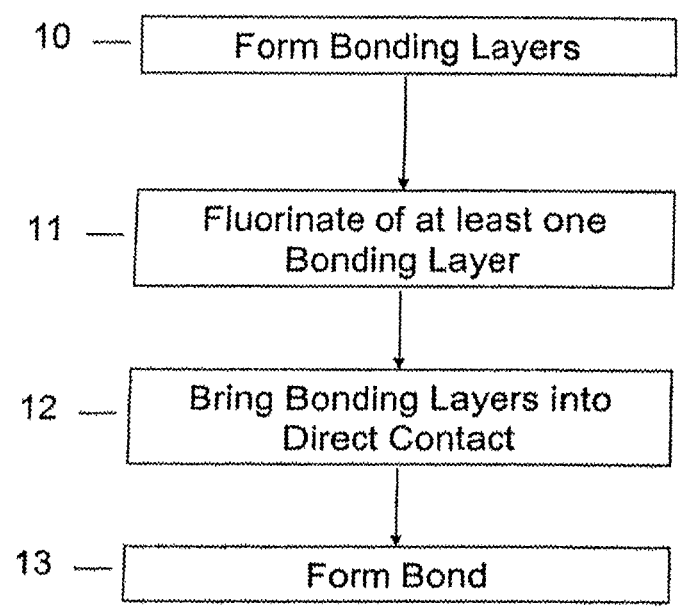
FIG. 1 is a flow diagram of an embodiment of the method according to the invention.
Figure 2A:
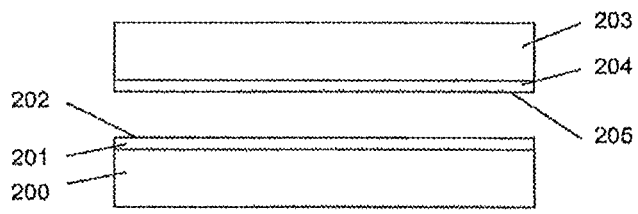
FIG. 2A is a diagram of a pair of unbonded substrates having respective bonding layers.
Figure 2B:
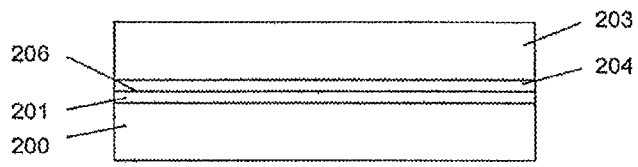
FIG. 2B is a diagram of a pair of unbonded substrates brought into direct contact.

Referring now to the drawings, wherein like reference numerals designate like or corresponding parts throughout the several views, and more particularly to FIGS. 1 and 2A-2B illustrating a first embodiment of the bonding process of the present invention is described. FIG. 1 illustrates in general terms the method according to the invention. Bonding layers are formed on an element to be bonded, such as a substrate or wafer (STEP 10). At least one of the bonding layers is fluorinated by, for example, exposing its surface to fluorine or fluorine implantation (STEP 11). The layers are brought into direct contact, forming a bonding interface, (STEP 12) and covalent bonds form as a result of a chemical reaction (STEP 13). The strength of the bond increases with time as additional covalent bonds form and/or byproducts from said chemical reaction diffuse away, from said bonding interface. Preferably, the bonding process is conducted at room temperature, about 20-25° C.

FIG. 2A shows two wafers 200, 203 having respective bonding layers 201, 204 with respective opposing surfaces 202, 205. Bonding layers 201 and 204 are composed of silicon oxide formed by any one or combination of a number of techniques including but not limited to sputtering, plasma enhanced chemical vapor deposition or thermal oxide. The surfaces of materials 201 and 204 may be relatively rough (>20 Å RMS) and require smoothing before being brought into direct contact. The film also may have sufficiently low surface roughness to bond without smoothing. Surfaces 202 and 205 may be prepared utilizing techniques described in application Ser. Nos. 09/410,054, 09/505,283 and 09/532, 886, to produce a smooth, activated surface. In brief, the surfaces of the bonding layers are polished to a small surface roughness, if needed, and the bonding layers are exposed to a fluorinating treatment like dilute aqueous HF, $CF_4$ or $SF_6$ plasma treatment, $F^+$ implantation, heated, if required, to fluorinate all or a desired part of the bonding layers, activated, and terminated with desired groups on the surface. The activation and termination steps may be carried out together. Only one or both of the bonding surfaces may be so treated. The surfaces 202 and 205 are brought together into direct contact, as shown in FIG. 2B, to form a bonded structure. Covalent bonding occurs across the interface 206 at room temperature between the two surfaces 202 and 205. The strength of the bond within said bonded structure increases with time as the number of covalent bonds increase and/or reaction byproducts resulting from the bringing together of said terminated surface(s) diffuse away from said bonding surfaces after said bonding surfaces are brought into direct contact.

Example

In a first example of the first embodiment, PECVD (Plasma Enhanced Chemical Vapor Deposition) silicon dioxide was deposited on single-side polished silicon wafers at 200-250° C. The thickness of the PECVD oxide is not critical and was arbitrarily chosen as ~1.0 μm. The wafers covered with the PECVD oxide layers were polished to smooth the surfaces. AFM (Atomic Force Microscopy) was employed to determine the RMS (Root Mean Square) value of surface micro-roughness to be 1-3 Å. The wafers were cleaned by a modified RCA 1 ($H_2O:H_2O_2:NH_4OH=5:1:0.25$) solution and spin-dried.

The wafers were divided arbitrarily into several groups with each wafer pair in a group treated in a specific way prior to bonding. In Group I, the oxide covered wafer pairs were treated in an oxygen plasma for thirty seconds in an reactive ion etch mode (RIB) at 100 mTorr. The plasma treated wafers were dipped in CMOS grade ammonium hydroxide aqueous solution containing 35% ammonia, termed "$NH_4OH$" hereafter, before being spin-dried and bonded in air at room temperature. In Group II, the oxide covered wafers were dipped in 0.025% HF aqueous solution for 30 seconds and spin-dried. The HF concentration may vary according to the type of silicon oxide used and can be from 0.01% to 0.5%. The wafers were then heated in air at 250° C. for 2-10 h. The wafers were cleaned again in RCA 1, oxygen plasma treated, dipped in $NH_4OH$ and spin-dried before bonded in air at room temperature.

Figure 3:
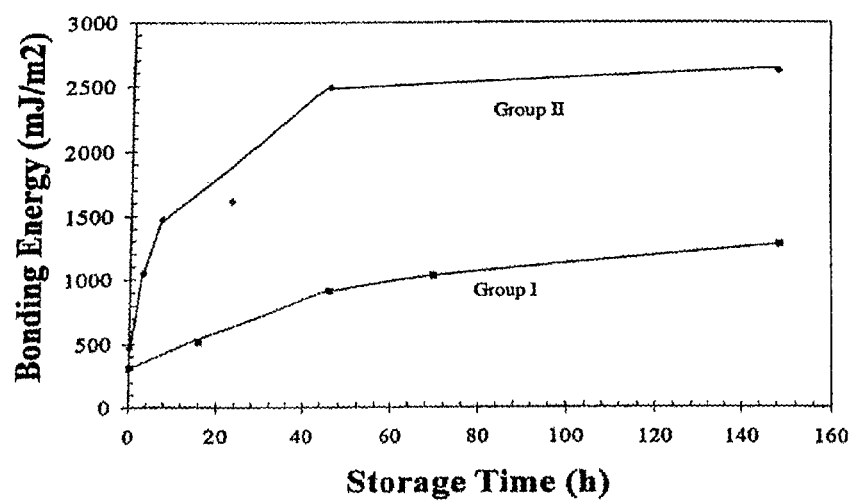
FIG. 3 is a graph of bonding energy as a function of storage time at room temperature in air of bonded wafer pairs with and without a bonding layer involving fluorine and ammonium.

FIG. 3 shows the bonding energy as a function of storage time at room temperature in air of the bonded wafer pairs of Group I and II, respectively. The bonding energy of wafer pairs in Group II increases quickly to 1000 mJ/m² within 3 hr and reaches the fracture energy of bulk silicon (2500 mJ/m²) after ~40 hr storage in air at room temperature and is significantly higher than the Group I wafer pairs. This is shown by the upper curve in FIG. 3. The HF dip and subsequent heating prior to room temperature bonding produce a large difference in bonding energy at room temperature between Group I and Group II bonded wafers.

Figure 4:
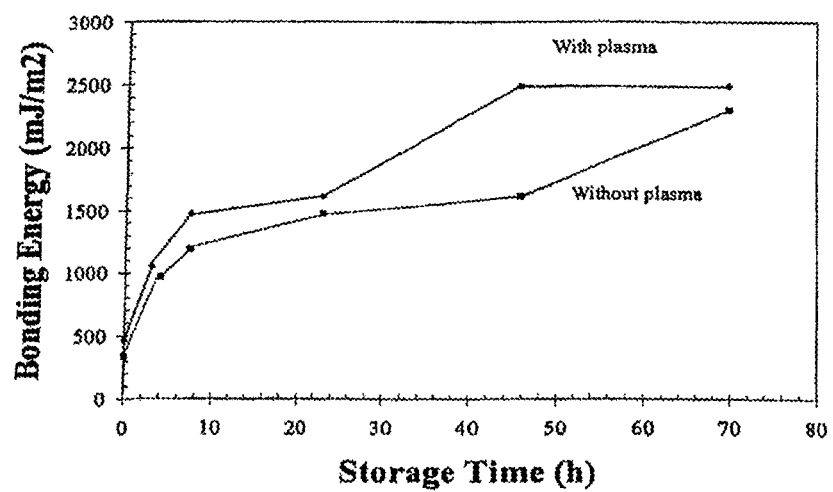
FIG. 4 is a graph of bonding energy as a function of storage time for bonded wafers processed with and without plasma treatment.

To determine the effect of the oxygen plasma treatment in enhancing the bonding energy at room temperature, another group (Group III) of wafers was prepared. The oxide covered wafer pairs in Group III were bonded at room temperature after the same process conditions as wafer pairs in Group II except that the oxygen plasma treatment step was omitted. A similar bonding energy was realized at room temperature for wafer pairs with and without plasma treatment as shown in FIG. 4. FIG. 4 indicates that the oxygen plasma treatment is not essential for the full chemical bonding at room temperature if wafer bonding is preceded by an HF aqueous dip and bake.

Figure 5:
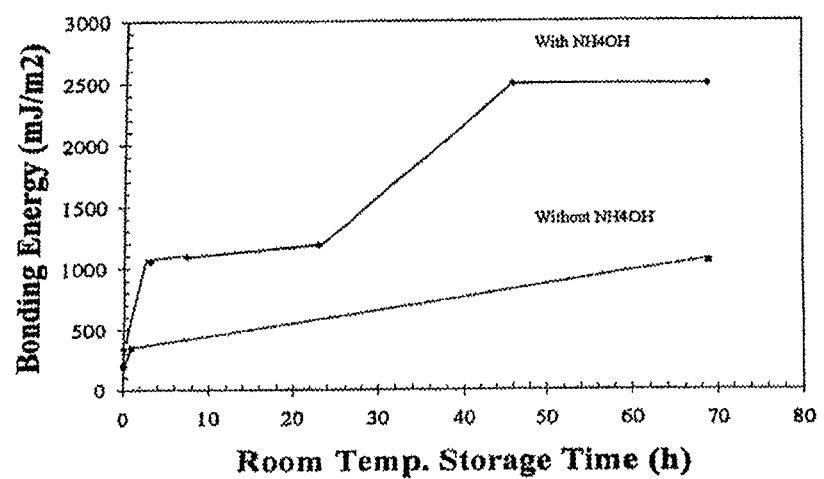
FIG. 5 is a graph of bonding energy at room temperature as a function of time for wafer pairs treated with and without ammonium.

In a further group, Group IV, the oxide covered wafer pairs were bonded at room temperature after the same process conditions as wafer pairs in Group II except that the step of $NH_4OH$ dip was eliminated and replaced by de-ionized water rinse. FIG. 5 shows that the bonding energy at room temperature is reduced by 60% for wafer pairs without $NH_4OH$ dip, 1051 mJ/m² versus 2500 mJ/m². The $NH_4OH$ dip thus significantly increases the bonding energy at room temperature.

The $NH_4OH$ treatment terminates the surface with $NH_2$ groups. Preferably, thus, in the method according to the invention $NH_2$ groups are terminated on the surface. This can be accomplished by exposure to a $NH_4OH$-containing gas, exposure to a $NH_4OH$-containing plasma, exposure to a $NH_4OH$-containing liquid vapor or exposure to a $NH_4OH$-containing liquid or combination of above treatments.

Figure 6:
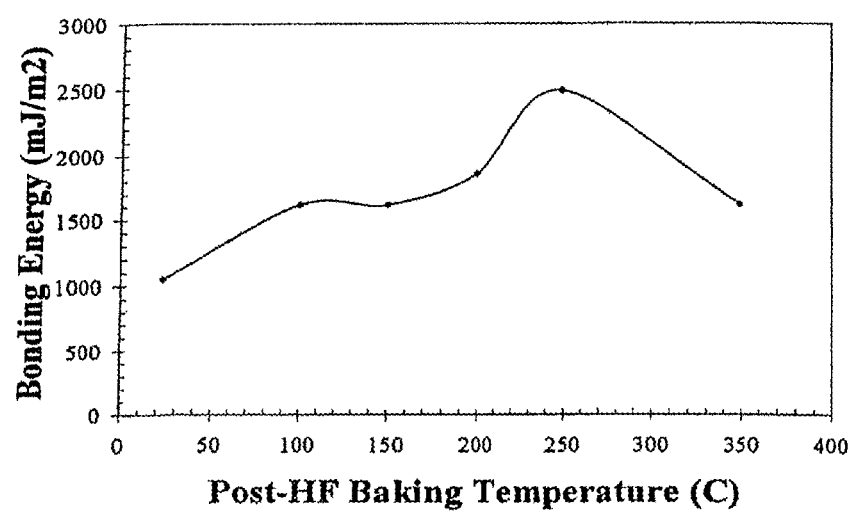
FIG. 6 is a graph of room temperature bonding energy as a function of a post-HF treatment baking temperature.

Wafer pairs were processed as those in Group II, but the post-HF baking was varied. When no baking was used and bonded wafers were stored in air at room temperature, a bond energy ~1000 mJ/m² was obtained. The increase in room temperature bonding energy as a function of a post-HF baking temperature for 10 hours of these wafer pairs is shown in FIG. 6. There is a temperature range for post-HF, pre-bonding baking in which a maximum room temperature bonding energy is achieved. The optimal results were obtained for a bake at about 250° C. Thus, in the method according to the invention the heating is preferably carried out at about 250° C.

The above results indicate, from the resultant high bond strengths, that each of the HF dip, the post-HF baking, and the $NH_4OH$ dip of the oxide-covered wafers contributes to chemical bonding at room temperature.

It is known in the art that adding fluorine into silicon dioxide can lower the oxide density and create micro-voids in the oxide network (see for example S. Lee and J-W. Park, J. Appl. Phys. 80(9) (1996) 5260, the entire contents of which are incorporated herein by reference). Recently, V. Pankov et al., J. Appl. Phys. 86 (1999) 275, and A. Kazor et al., Appl. Phys. Lett. 65 (1994) 1572, the entire contents of which are incorporated herein by reference, have reported that fluorine incorporation causes Si—O—Si ring breaking and changes of the silicon dioxide network structure towards large size rings with lower density via the following reaction:

$$\text{Si—O+F} \rightarrow \text{Si—F+O+1.1 eV} \tag{1}$$

This modified structure facilitates a higher diffusion rate of impurities and enhanced moisture absorption. Furthermore, it is well known that fluorinated silicon dioxide (SiOF) absorbs water effectively when it is exposed to humid atmosphere. V. Pankov, J. C. Alonso and A. Ortiz, J. Appl. Phys. 86 (1999), p. 275, the entire contents of which are incorporated herein by reference.

During a HF dip such as the dip in 0.025% HF aqueous solution of the present invention, in addition to the formation of Si—F and Si—OH groups on the silicon dioxide surface, some F ions are also generated as follows:

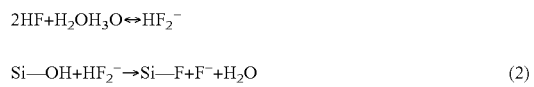

$$2HF+H_2O H_3O \leftrightarrow HF_2^-$$

$$\text{Si—OH+HF}_2^- \rightarrow \text{Si—F+F}^-+H_2O \tag{2}$$

See for example H. Nielsen and D. Hackleman, J. Electrochem. Soc. Vol. 130 (1983) p. 708, the entire contents of which are incorporated herein by reference. The post-HF baking at elevated temperatures helps remove water that is generated by the above reaction and enhances the fluorine diffusion. Fluorine atoms diffuse into the oxide and react with Si—O—Si bonds to form SiOF according to Eq. (1).

A higher temperature post-HF bake could possibly produce a thicker SiOF layer on the oxide surface leading to a higher bonding energy at room temperature due to higher efficiency of water absorption. However, the results in FIG. 6 for baking temperature up to 350° C. show that, when the post HF baking temperature is higher than 300° C., the resultant bonding energy is actually lower than that baked at lower temperatures. Chang et al., Appl. Phys. Lett. vol. 69 (1996) p. 1238, the entire contents of which are incorporated herein by reference, have reported that if an SiOF deposition temperature is higher than 300° C., the moisture resistance of the layer starts to increase due to loss of the fluorine atoms in the oxide. Therefore, the reduction of the bonding energy at room temperature for wafer pairs that were post-HF annealed at 350° C. prior to bonding may be attributed to the fact that the SiOF layers at the bonding interface absorb less moisture than that of 250° C. annealed layers even though the SiOF layer may be thicker.

In a preferred process of the present invention, the outermost surface termination of silicon dioxide is converted from Si—F after post-HF annealing to Si—OH after a RCA 1 solution cleaning by the exchange reaction:

$$Si\text{—}F+HOH \rightarrow Si\text{—}OH+HF \quad (3)$$

Most Si—OH groups are then converted to Si—NH$_2$ after an, for example, aqueous NH$_4$OH dip (that contains about 65% H$_2$O):

$$Si\text{—}OH+NH_4OH \rightarrow Si\text{—}NH_2+2HOH \quad (4)$$

However, the surface is still partially terminated in OH groups after the NH$_4$OH dip due to the H$_2$O content in the NH$_4$OH.

The Si—NH$_2$ and Si—OH terminated surfaces are bonded at room temperature and the following reactions take place when the two surfaces are in sufficient proximity:

$$Si\text{—}NH_2+Si\text{—}NH_2 \leftrightarrow Si\text{—}N\text{—}N\text{—}Si+H_2 \quad (5)$$

$$Si\text{—}OH+HO\text{—}Si \leftrightarrow Si\text{—}O\text{—}Si+HOH \quad (6)$$

For example, Q.-Y. Tong and U. Goesele, J. Electroch. Soc., 142 (1995), p. 3975 have reported that Si—O—Si covalent bonds can be formed between two Si—OH groups that are hydrogen bonded on opposite bonding hydrophilic surfaces at room temperature. However, the above polymerization reaction is reversible at temperatures less than ~425° C. See for example M. L. Hair, in Silicon Chemistry, E. R. Corey, J. Y. Corey and P. P. Gaspar, Eds, Wiley, New York, (1987), p. 482, the entire contents of which are incorporated herein by reference.

Figure 7:
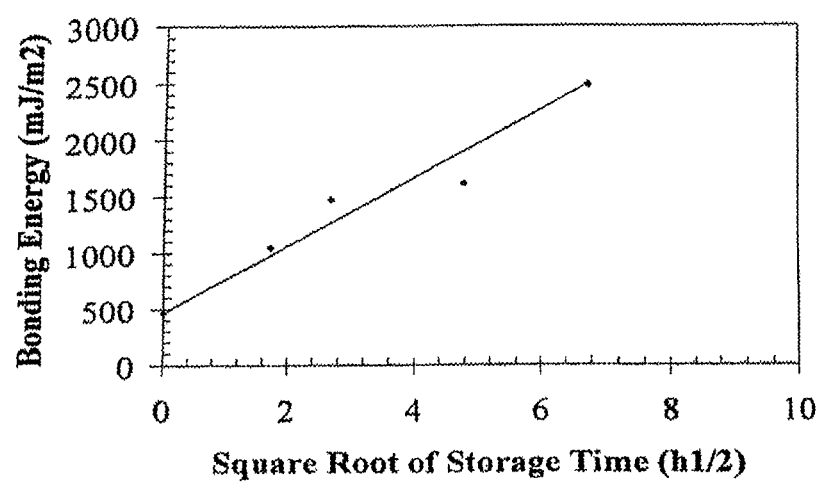
FIG. 7 is a graph illustrating the linear relation of the measured bonding energy and square root of storage time.

If the water and hydrogen generated by the above reactions can be removed without heat, the covalent bonds become not subject to reversibility according to the above reactions and permanent covalent bonding at room temperature results. According to the present invention, by fluorinating the oxide before bonding, fluorine is incorporated into the oxide away from the bonding interface and the by-product water of the above polymerization reaction can be absorbed by diffusing from the bonding interface into the low density fluorinated oxide away from the bonding interface, leading to a high degree of covalent bonding across the interface at room temperature. The bonding energy as a function of the square root of storage time at room temperature is shown in FIG. 7 for oxide covered wafer pairs bonded at room temperature using the same process conditions as those in Group II. For a constant total amount of water S, the water concentration at the bonding interface $C_{s1}$ is reversibly proportional to the square root of time t and water diffusion coefficient $D_1$ and the hydrogen concentration at the bonding interface $C_{s2}$ is reversibly proportional to the square root of time t and hydrogen diffusion coefficient $D_2$:

$$C_{s1}=S/(\pi D_{1t})^{1/2} \quad (7.1)$$

$$C_{s2}=S/(\pi D_{2t})^{1/2} \quad (7.2)$$

See for example J. C. C. Tsai, in VLSI Technology, S. M. Sze, Ed, McGraw-Hill, Auckland, (1983), p. 147, the entire contents of which are incorporated herein by reference.

As the bonding energy γ is reversibly proportional to the water and hydrogen concentration at the bonding interface, the bonding energy should proportional to the inverse of the hydrogen and water concentration at the interface:

$$\gamma \sim (C_{s1}+C_{s2})^{-} \quad (8)$$

Although the concentration of NH$_2$ termination may be greater than OH termination resulting in a higher concentration of H$_2$ than H$_2$O after bonding, the diffusivity of hydrogen is expected to be significantly higher than that of water due to its much smaller size (2.5 Å vs. 3.3 Å). The increase in bond energy may then be dominated by the diffusion of water and be proportional to the square root of time if the diffusion coefficient is a constant:

$$1/C_{s1}=(\pi D_{1t})^{1/2}/S \quad (9)$$

Consistent with this understanding, an approximate linear relation of the measured bonding energy vs. square root of storage time is observed, as shown in FIG. 7, is consistent with water (and hydrogen) diffusion away from the bonding interface into the fluorinated oxide layer. Thus, the diffusion of water (and hydrogen) away from the bond interface is likely responsible for the enhancement of the bonding energy observed in the present invention, but the present invention is not limited to reactions that result in water byproducts and the diffusion of said water (and hydrogen) byproducts away from said bond interface.

For a bonding surface that is terminated primarily with OH groups, for example one not treated with NH$_4$OH as, for example, the wafers in Group IV, there is a substantially higher concentration of H$_2$O to diffuse away from the interface. Therefore, the bonding energy of wafer pairs with NH$_4$OH dip increases quickly with storage time and reaches a much higher value than that of wafer pairs without NH$_4$OH dip as shown in FIG. 5.

A method of fluorinating an oxide layer for use in subsequent bonding is shown in FIGS. 8A-8C. After forming an oxide layer 81 on a substrate to be bonded 90 (FIG. 9A), the oxide is exposed to HF either by a wet process or by a gaseous process. An example of a gaseous process is exposure of the wafer surface to HF vapor without immersion in an HF solution. The oxide may be formed in a number of ways including but not limited to sputtering, plasma enhanced chemical vapor deposition (PECVD), and thermal growth. The substrate may be a silicon wafer with or without devices formed therein. Alternatively, F may be introduced into the oxide layer by fluorine ion implantation of 1×10$^{15}$ to 1×10$^{16}$/cm$^2$ with energy of 20-30 keV.

After annealing at ~250° C. a SiOF surface bonding layer 83 of about 0.5 μm thick is formed in the surface 82 of layer 81 (FIG. 8B). It is noted that the dimensions of layer 83 are not shown to scale. The substrate is ready for bonding to another substrate 84 having a second bonding layer 85 also having an SiOF layer 86 formed in the surface, the bonding able to be performed in ambient at room temperature, as shown in FIG. 8C. A very high density of covalent bonds that is higher by a factor of up to 2.5 than pairs bonded using no HF dip and bake (as inferred by measured bond strength) is formed between the substrates at room temperature.

It is also possible to bond the SiOF surface layer to another bonding layer without an SiOF surface layer. It is also possible to form SiOF surface layers by F+ implantation and/or etching (for example dry etching using SF$_6$ and/or CF$_4$) of silicon oxide followed by baking at an elevated temperature. It is further possible to form SiOF surface layers by PECVD (Plasma-Enhanced Chemical Vapor Deposition). For example, electron-resonance PECVD oxide deposition using SiF$_4$/Ar/N$_2$O at room temperature (S. P. Kim, S. K. Choi, Y. Park and I Chung, Appl. Phys. Lett. 79 (2001), p. 185, PECVD oxide deposition using Si$_2$H$_6$/CF$_4$/N$_2$O at 120° C., J. Song, P. K. Ajmera and G. S. Lee, Appl. Phys. Lett. 69 (1996), p. 1876 or SiF$_4$/O$_2$/Ar at 300° C. S. Lee and J. Park, Appl. Phys. Lett. 80 (1996), p. 5260.

Figure 9A:
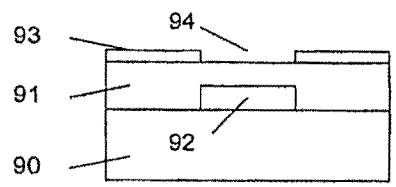
FIGS. 9A-9E show schematically localized fully covalent bonding regions in a bonded wafer pair.
Figure 9B:
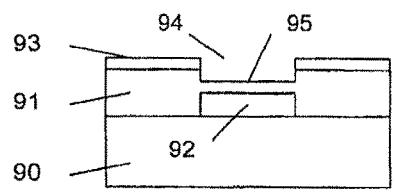
Figure 9C:
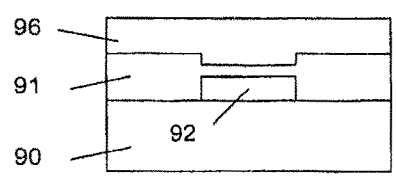

The HF-dip and annealing to form the SiOF surface bonding layer on silicon dioxide surface has unique applications. FIGS. 9A-E show schematically that the present invention can be used to produce a localized variation in covalent bonding and hence bond energy across a surface. FIG. 9A shows that, at the selected regions of exposed silicon dioxide on a silicon wafer, in this case the silicon device regions, a dilute HF (or buffered HF) solution is used to etch a small amount of oxide from the surface. Substrate 90 has a silicon dioxide layer 91 and a device portion 92. The device portion could be a discrete device, a circuit or an integrated circuit. Photoresist or masking layer 93 is formed on oxide 91 having an aperture 94. The dilute HF solution etches the silicon dioxide exposed by aperture 94 to create recessed area 95. The recessed area may have a very wide range of depth from a few mu to many microns, although thicker depths are also possible (FIG. 9B). The photoresist or masking layer is resistant to etching by HF. Layer 93 is removed, followed by, as shown in FIG. 9C, deposition of silicon dioxide at ~250° C. across the entire surface. The 250° C. re-deposition process mimics in effect the post-HF baking treating and buries the dilute HF treated surface.

Figure 9D:
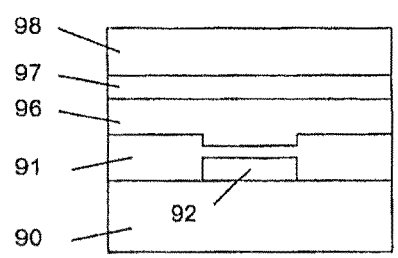

A CMP process step may then be used to planarize the recessed area and improve the surface roughness. A Group I surface treatment is then applied to layer 96, and the silicon wafer is bonded at room temperature to another wafer, such as a silicon dioxide layer 97 covering wafer 98, as shown in FIG. 9D. The room temperature bonding energy at the HF etched regions is then significantly higher than the non-HF etched regions along the bonding interface according to the present invention.

Figure 9E:
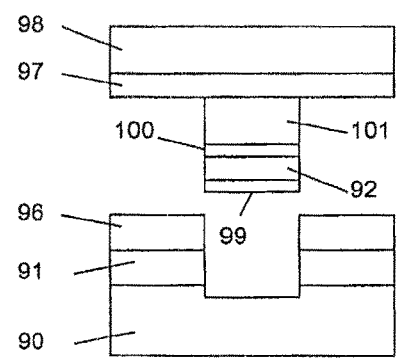

When a bonded pair so farmed is forcibly separated, the resulting separation is typically not at the bonding interface of the HF dipped device region. Instead, a part of the silicon wafer or the silicon wafer itself may fracture beneath the bonded interface and peel from the substrate, as shown schematically in FIG. 9D. Portion 99 of substrate 90 is attached to device or circuit 92. Portion 100 of layer 91 and portion 101 of layer 96 are separated by the fracture (FIG. 9E).

Figure 10:
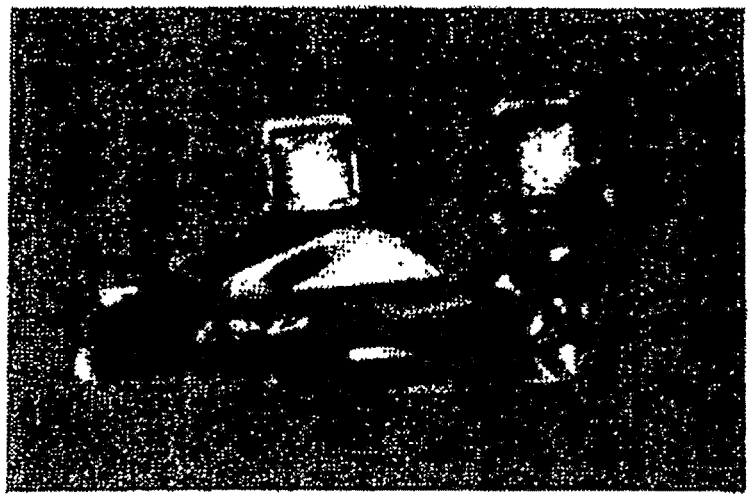
FIG. 10 is a micrograph depicting the fractured Si subsurface beneath the bonded interface of the present invention.

A physical example of the FIG. 9 schematic is shown in the micrograph of FIG. 10 that shows the remnant of a wafer from a bonded pair that was forcibly separated. This remnant shows a fracture in a silicon wafer beneath the bonded interface where the surface was exposed to HF. This is consistent with the bonding energy between silicon oxide layers in these locations being higher than the fracture energy of bulk silicon. In other locations at the bonding interface of the wafer pair, also shown in FIG. 10, the surface was not exposed to HF. In these locations, the bonding energy is expected to be lower than the fracture energy of bulk silicon. This is consistent with the lack of silicon peeling in these areas.

Figure 11:
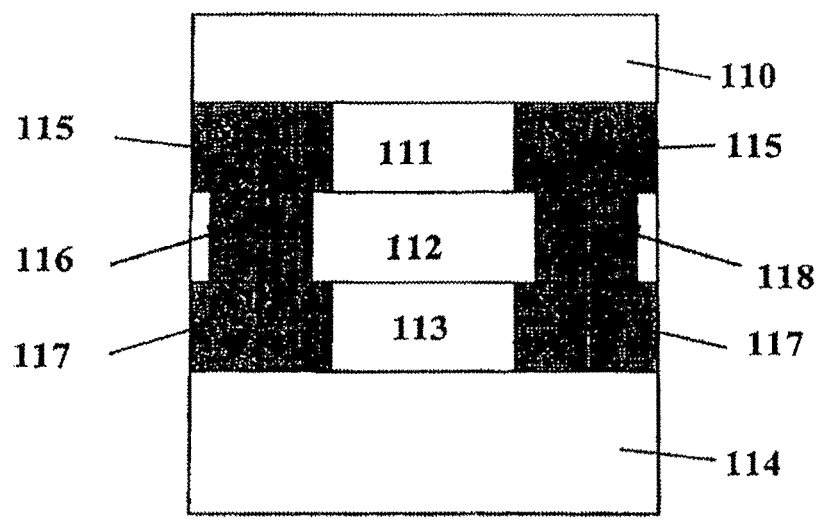
FIG. 11 is a diagram of an embedded low-k oxide structure.

This localized fluorination may also result in the formation of a lower k dielectric due to the introduction of F into the oxide which lowers the dielectric constant of the material. This feature of the present invention may be used to advantage in the design of integrated circuits or other structures. For example, a low k dielectric can be formed between the metal lines, but not at the via level in multi-layer interconnects in VLSI devices, by an etching process, such as exposure to HF, at an area where low k dielectric is desired followed by an oxide deposition at ~250° C. FIG. 11 shows an example of an embedded low k structure. In FIG. 11, low k material layer portions 111 and 113 are formed between oxide layers, such as $SiO_2$, 110, 112 and 114. Metal layers 115 and 117 are connected by vias 116 and 118.

Example

A second example of the method will be described again using FIGS. 8A-8C. A first oxide layer 81 is formed on substrate 80 (FIG. 8A). Fluorine is introduced into film 81 by one of the procedures described above, namely, exposure to HF or exposure to a F-containing gas. A second oxide film 83 is formed on film 81 by PECVD, for example (FIG. 8B). Fluorine is introduced into the second film by diffusion and/or surface segregation. It may also be introduced into the second film by the use of an appropriate F-containing precursor for the deposition of said oxide film 83. It is noted that the dimensions of films 81 and 83 are not to scale for this example, since the figures were also used to describe an example where film 83 is formed in the surface of film 81, but the figures do accurately represent the position of films 81 and 83. In this example, the structure does not need to be baked to create a fluorinated layer that assists in the removal of reaction byproducts because of the deposition temperature and/or F-containing precursor associated with said oxide film 83. The sample is then ready to be bonded to another wafer as shown in FIG. 8C.

Figure 12:
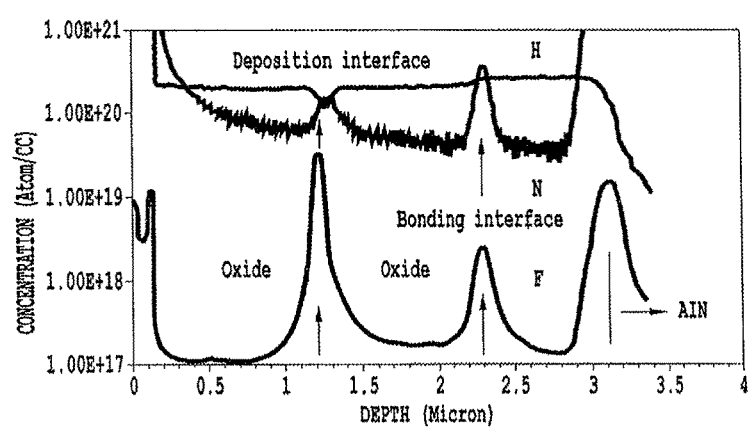
FIG. 12 is a SIMS (Secondary Ion Mass Spectroscopy) measurement.

SIMS (Secondary Ion Mass Spectroscopy) measurements were taken on the sample shown in FIG. 10 in the HF exposed surface area of the sample processed where a silicon oxide layer is formed and exposed to an HF solution, followed by a deposition of oxide at 250° C. The sample was then dipped in an $NH_4OH$ solution. The measurement is shown in FIG. 12. The existence of Si—N covalent bonds at the bonding interface of bonded wafers that were dipped in $NH_4OH$ prior to bonding is confirmed by the SIMS measurement shown in FIG. 12. Furthermore, the SIMS profile measurement clearly confirms the existence of a high F concentration in the vicinity of the oxide deposition interface on the HF etched recess. Since the only HF exposure to this sample was before the oxide deposition, it is reasonable to attribute the F signal at the bonding interface to the diffusion of F through the deposited oxide and accumulation at the oxide surface during the 250° C. oxide deposition. The fluorine concentration at the bonding interface is about $2 \times 10^{18}/cm^3$ and the peak nitrogen concentration is $\sim 3.5 \times 10^{20}/cm^3$. The F located away from the bonding interface facilitates removal of reaction byproducts, such as HOH, resulting in an increased concentration of permanent covalent bonds and bond strength.

The post-HF aqueous dip bake of 10 hours at 250° C. is comparable to the temperature and duration of iterated PECVD oxide deposition. It is thus possible to avoid a separate annealing step after the HF dip by instead depositing a PECVD oxide on the HF treated surface. An example of this advantage is in the planarization of a non-planar wafer in preparation for wafer bonding. For example, the room temperature bonding can be very useful for the bonding of integrated circuits (ICs). However, ICs typically have a non-planar surface that is not conducive to the planar and smooth surfaces preferable for room temperature direct wafer bonding. A method for improving this planarity is to deposit an oxide layer followed by CMP. This is similar to the example provided above with the exception that the non-planarity may be 1 micron or more. In this case of increased non-planarity, a thicker oxide is deposited or more than one iteration of oxide deposition and CMP is used to achieve the desired planarity. In this planarization process, if the HF treatment is applied before the (last) oxide depositions, then the subsequent oxide deposition will have an increased F concentration and a F accumulation at its surface after the oxide deposition. This F concentration can then result in a higher bond energy, for example with a Group I pre-bond treatment as described above, without any post-oxide-growth heat treatment, than would otherwise be obtained if the HF treatment was not used.

The method of the present invention can be carried out in ambient conditions rather than being restricted to high or ultra-high vacuum (UHV) conditions. Consequently, the method of the present invention is a low-cost, mass-production manufacturing technology. The method is also not limited by the type of wafer, substrate or element bonded. The wafer may be a bulk material, such as silicon, a wafer having devices formed therein, a handler substrate, a heat sink, etc.

Figure 2C:
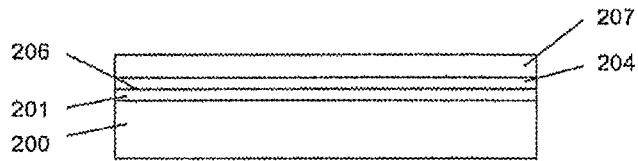
FIG. 2C is a diagram of the pair of substrates in FIG. 2B after a portion of the substrate is removed.
Figure 2D:
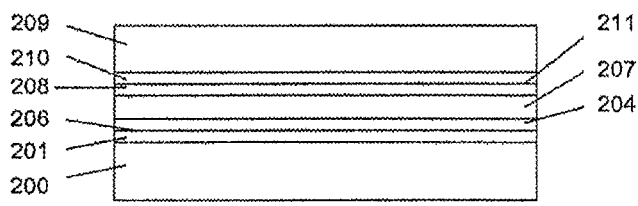
FIG. 2D is a diagram of the pair of substrates of FIG. 2C after bonding a third substrate.

While FIGS. 2A and 2B show two devices bonded together, the method is not limited to bonding two devices. One of substrate 200 and 203 may be removed and the process repeated, as shown in FIGS. 2C and 2D. In FIG. 2C the substrate 203 of the structure shown in FIG. 2B is subject to substrate removal by a procedure including one or more processes of grinding, lapping, polishing and chemical etching, to leave portion 207. The appropriate process or processes may be determined based upon the type of the materials or the structure subjected to the process or processes. In a case where the substrate 203 contains devices or other elements in its surface, all or essentially all of substrate 203 except for the region where the devices or other elements reside may be removed. The amount removed can vary based upon the materials, the etching characteristics of the materials, or the details of the particular application.

Another bonding layer 208 of the same or different material, such as a deposited silicon oxide material is formed on portion 207 (as shown in FIG. 2C) and another substrate 209 with bonding layer 210 is prepared as described above, namely, the surface of layer 210 is smoothed to a surface roughness in the above-mentioned ranges, and bonded to layer 108 at interface 211 in the same manner as described above. The resulting structure is shown in FIG. 2D. The process may be performed N times, as desired, to produce an (N+1)-integrated structure.

The present invention can bond locally or across an entire wafer surface area. In other words, smaller die may be bonded to a larger die. This is shown in FIG. 13 where several smaller die 133, 135 and 137 having respective bonding layers 134, 136 and 138 are bonded to surface 132 of bonding layer 131.

Figure 14A:
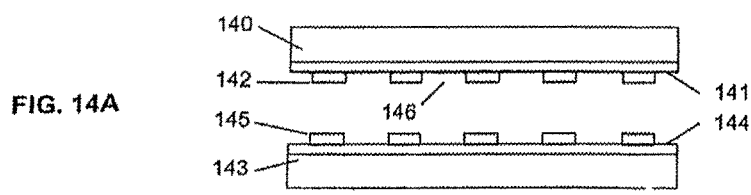
FIGS. 14A-14C depict schematically an application of the bonding process of the present invention to metal to metal bonding.
Figure 14B:
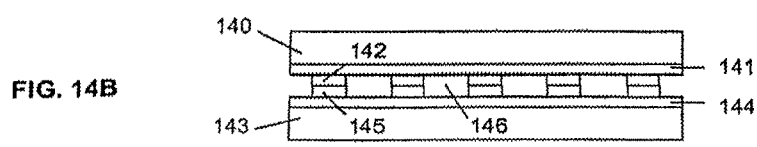
Figure 14C:
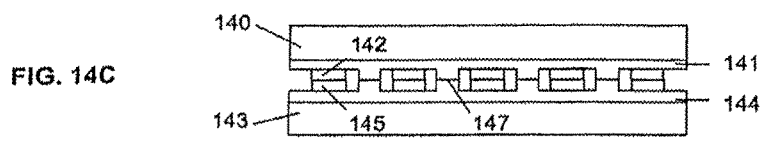

The present invention may also be used in room temperature metal direct bonding, as described in application Ser. No. 10/359,608, the contents of which are herein incorporated by reference. As shown in FIG. 14A, two substrates 140 and 143 have respective bonding layers 141 and 144 and metal pads 142 and 145. Gaps 146 separate the pads and the upper surfaces of the pads extend above the upper surface of the layers 141 and 144. The surface of layers 141 and 144 are prepared for bonding as discussed above, and then the metal pads of the substrates are brought into contact (FIG. 14B). At least one of the substrates elastically deforms and the bonding layers 141 and 144 contact and begin to bond at one or more points of contact between the layers 141 and 144 (FIG. 14C). The bond propagates to form a bond 147. At room temperature, a strong bond (such as a covalent bond) forms.

Figure 15:
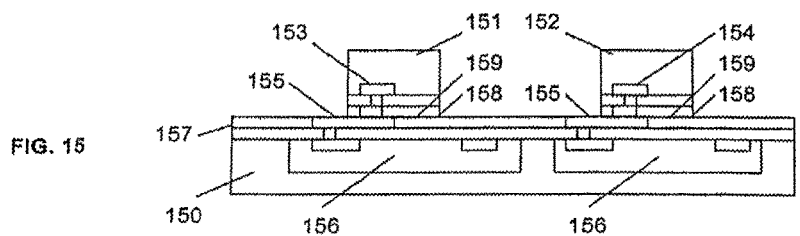
FIG. 15 illustrates metal to metal bonding of a plurality of devices to a larger substrate.

FIG. 15 shows metal bonding of smaller devices or die 151 and 152 to a single larger substrate 150. Structures 153 and 154 in devices 151 and 152, respectively, may be active devices or contact structures. Structures 156, which may also be or contain active devices, in substrate 150 have contact structures 155. A bond is formed at interface 159 between bonding layer 157 on substrate 150 and bonding layers 158 on the smaller devices 151 and 152.

The metal direct bonding offers numerous advantages including elimination of die grinding and thinning, via etching and metal deposition to form electrical interconnections to interconnect bonded wafers as described in the referenced art. This eliminates any mechanical damage caused by these die grinding and thinning. Further, the elimination of deep via etching avoids step coverage problems, allows the process to be scaled to smaller dimensions, resulting in smaller via plugs to contact bonded wafers. The method is compatible with other standard semiconductor processes, and is VLSI compatible.

Figure 16A:
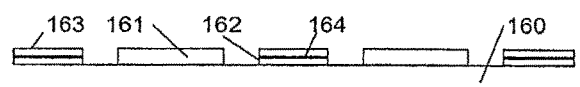
FIGS. 16A-16E illustrate an application of the invention to hermitic encapsulation.
Figure 16B:
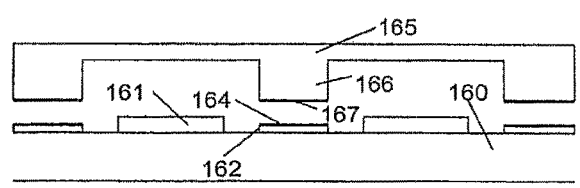
Figure 16C:
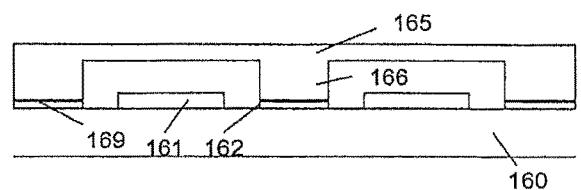
Figure 16D:
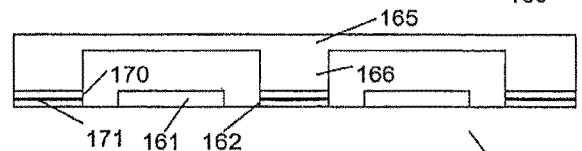
Figure 16E:
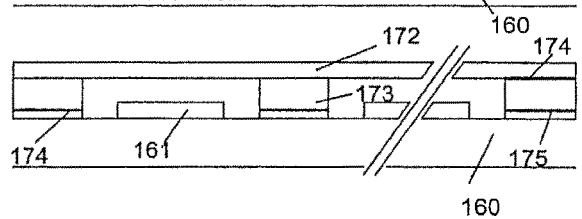

In a further example, the method of the invention can be applied to hermitic encapsulation as shown in FIGS. 16A-16E. A fluorinated bonding layer 162 is formed on the carrier, and protected during the formation of a device 161 such as a MEMS. FIG. 16A shows the steps of forming bonding layer 162 on carrier 160, followed by forming protective film 163 on bonding layer 162, and forming device 161 on carrier 160. As an example, carrier 160 could be a silicon substrate and bonding layer 162 could be a deposited oxide layer having the appropriate surface roughness and planarity characteristics to facilitate room temperature bonding. As shown in FIG. 16B, film 163 has been removed after the formation of device 161, and a cover 165 having portions 166 with surfaces 167, prepared with the appropriate surface roughness and planarity characteristics, in position to be bonded to surface 164 of bonding layer 162. Surface 167 is brought into direct contact with surface 164 and bonded, to form bond 169 as shown in FIG. 16C. FIG. 16D represents a modification of the method shown in FIGS. 16A-16C where bonding layer 170 is formed on portions 166, with appropriate surface and planarity characteristics. The surface of film 170 is brought into contact with surface of film 162 and bonded to form bond 171. Another modification of the method shown in FIGS. 16A-16C is illustrated in FIG. 16E, where the cover consists of plate 172 and portions 173 formed on plate 172. The surfaces of portions 173 are prepared as discussed above, and bonded to film 162 to form bond 174. The right hand portion of FIG. 16E shows a further modification where portion 173 is bonded to plate 172 with film 174 and to the surface of layer 162 to form bond 175. In either instance, portion 173 could be an oxide or silicon material, and plate 172 could be a silicon plate.

According to the present invention, silicon dioxide formed by any method such as deposition, sputtering, thermally or chemically oxidation, and spin-on glass, can be used in pure or doped states.

In a preferred embodiment of the present invention, an ammonia solution dip of wafers covered by fluorinated surface silicon dioxide layers, after hydration and prior to bonding, significantly increases the bonding energy at room temperature due to the formation of Si—N bonds and hydrogen.

An HF-dip and post-HF baking can produce localized covalent bonding at a desirable location on the wafer such as in an etched window in the silicon dioxide layer. Alternatively F implantation and subsequent annealing can produce localized covalent bonding at desirable locations.

According to the present invention, the HF-dip and post-HF baking can form low k dielectric locally in silicon dioxide layers. For instance, low k dielectric can be formed between the metal lines but not at the via level in multi-layer interconnects in VLSI devices.

The method of the invention is applicable to any type of substrate, such as heat sinks, handler or surrogate substrates, substrates with active devices, substrates with integrated circuits, etc. Substrates of different technologies, i.e. silicon, III-V materials, II-VI materials, etc. may be used with the invention.

Applications of the present invention include but are not limited to vertical integration of processed integrated circuits for 3-D SOC, micro-pad packaging, low-cost and high-performance replacement of flip chip bonding, wafer scale packaging, thermal management and unique device structures such as metal base devices.

Numerous modifications and variations of the present invention are possible in light of the above teachings. It is therefore to be understood that within the scope of the appended claims, the invention may be practiced otherwise than as specifically described herein.

The invention claimed is:

1. A bonded structure comprising:
a first semiconductor element;
a first bonding layer disposed on the first semiconductor element, the first bonding layer comprising a first oxide layer comprising fluorine and a second oxide layer comprising fluorine deposited directly on the first oxide layer to define an interface between the first oxide layer and the second oxide layer, the first oxide layer separate from the second oxide layer, wherein the first oxide layer and the second oxide layer are planarized;
a second semiconductor element; and
a second bonding layer disposed on the second semiconductor element,
wherein the second oxide layer and the second bonding layer are directly bonded to one another.

2. The bonded structure of claim 1, further comprising a fluorine concentration within the first bonding layer having a first peak at an interface between the first and second bonding layers and a second peak at the interface between the first and second oxide layers.

3. The bonded structure of claim 1, wherein the second bonding layer comprises a third oxide layer on the second semiconductor element and a fourth oxide layer on the third oxide layer.

4. The bonded structure of claim 1, wherein the second oxide layer is disposed directly on the first oxide layer without intervening layers.

5. The bonded structure of claim 1, wherein the second oxide layer is planarized to a level sufficient for direct bonding with the second bonding layer.

6. The bonded structure of claim 1, wherein the second oxide layer is polished to have a surface roughness of 1 Å to 3 Å.

7. The bonded structure of claim 1, wherein the first bonding layer comprises a surface SiOF layer.

8. The bonded structure of claim 1, further comprising a nitrogen species at an interface between the first and second bonding layers.

9. The bonded structure of claim 8, further comprising Si—N covalent bonds at the interface between the first and second bonding layers.

* * * * *

UNITED STATES PATENT AND TRADEMARK OFFICE
CERTIFICATE OF CORRECTION

PATENT NO. : 11,760,059 B2
APPLICATION NO. : 16/521493
DATED : September 19, 2023
INVENTOR(S) : Qin-Yi Tong It is certified that error appears in the above-identified patent and that said Letters Patent is hereby corrected as shown below:

On the Title Page

Column 1, Lines 1-2, under Applicant, delete "INVENSAS BONDING TECHNOLOGIES, INC.," and insert --ADEIA SEMICONDUCTOR BONDING TECHNOLOGIES INC.,--.

Column 1, Line 1, under Inventors, after "Tong," insert --Deceased;--.

In the Specification

In Column 5, Line 14, delete "(RIB)" and insert --(RIE)--.

In Column 7, Line 64 (Approx.), delete "$\gamma - (Cs_1 + Cs_2)^-$" and insert --$\gamma - (Cs_1 + Cs_2)^{-1}$--.

Signed and Sealed this
Thirtieth Day of April, 2024

*Katherine Kelly Vidal*
Katherine Kelly Vidal
*Director of the United States Patent and Trademark Office*